(12) United States Patent
Shin

(10) Patent No.: US 12,144,161 B2
(45) Date of Patent: *Nov. 12, 2024

(54) FLEXIBLE DISPLAY MODULE AND ELECTRONIC DEVICE COMPRISING THE SAME

(71) Applicant: LG Display Co., Ltd., Seoul (KR)

(72) Inventor: Insik Shin, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 348 days.

This patent is subject to a terminal disclaimer.

(21) Appl. No.: 17/668,122

(22) Filed: Feb. 9, 2022

(65) Prior Publication Data
US 2022/0272881 A1    Aug. 25, 2022

Related U.S. Application Data

(63) Continuation of application No. 16/707,909, filed on Dec. 9, 2019, now Pat. No. 11,284,547.

(30) Foreign Application Priority Data

Dec. 13, 2018  (KR) ........................ 10-2018-0161387

(51) Int. Cl.
| | | |
|---|---|---|
| *H05K 1/18* | (2006.01) | |
| *H05K 5/00* | (2006.01) | |
| *H05K 5/03* | (2006.01) | |
| *H05K 7/20* | (2006.01) | |
| *H05K 9/00* | (2006.01) | |

(52) U.S. Cl.
CPC ........... *H05K 9/0054* (2013.01); *H05K 1/189* (2013.01); *H05K 5/0017* (2013.01); *H05K 5/03* (2013.01); *H05K 7/20963* (2013.01); *H05K 2201/10083* (2013.01); *H05K 2201/10128* (2013.01)

(58) Field of Classification Search
CPC .... H05K 9/0054; H05K 1/189; H05K 5/0017; H05K 5/03; H05K 7/20963; H05K 2201/10083; H05K 2201/10128
USPC ........................................................ 361/749
See application file for complete search history.

(56) References Cited

U.S. PATENT DOCUMENTS

| | | | | |
|---|---|---|---|---|
| 10,462,896 | B1 * | 10/2019 | Kwon | .................. G06F 1/1626 |
| 10,693,089 | B2 * | 6/2020 | He | ........................ H10K 77/111 |
| 11,284,547 | B2 * | 3/2022 | Shin | ........................ G06F 1/203 |
| 2019/0163003 | A1 | 5/2019 | Kim et al. | |

(Continued)

FOREIGN PATENT DOCUMENTS

| | | |
|---|---|---|
| KR | 10-2015-0014713 A | 2/2015 |
| KR | 10-1506275 B1 | 3/2015 |
| KR | 10-2015-0070572 A | 6/2015 |

(Continued)

*Primary Examiner* — Binh B Tran
(74) *Attorney, Agent, or Firm* — Birch, Stewart, Kolasch & Birch, LLP

(57) ABSTRACT

A flexible display apparatus can include a flexible substrate including a display portion, a bending portion and a pad portion; a first back plate configured to support the display portion of the flexible substrate; a second back plate configured to support the pad portion of the flexible substrate; a bending maintenance member disposed between the first back plate and the second back plate and configured to support the bending portion of the flexible substrate; and a conductive heat dissipating portion disposed to a rear surface of the first back plate.

21 Claims, 6 Drawing Sheets

(56) References Cited

U.S. PATENT DOCUMENTS

2019/0165300 A1* 5/2019 Lee ................... H10K 50/844
2019/0207130 A1* 7/2019 He .................... H10K 71/00

FOREIGN PATENT DOCUMENTS

| KR | 10-2017-0071986 A | 6/2017 |
| KR | 10-2017-0106589 A | 9/2017 |
| KR | 10-2018-0013328 A | 2/2018 |
| KR | 10-2018-0033510 A | 4/2018 |

* cited by examiner

FLEXIBLE DISPLAY MODULE AND ELECTRONIC DEVICE COMPRISING THE SAME

CROSS-REFERENCE TO RELATED APPLICATIONS

This application is a Continuation of U.S. patent application Ser. No. 16/707,909, filed on Dec. 9, 2019 (now U.S. Pat. No. 11,284,547, issued on Mar. 22, 2022), which claims the priority benefit of the Korean Patent Application No. 10-2018-0161387 filed in the Republic of Korea on Dec. 13, 2018, the entire contents of all of these applications being hereby incorporated by reference into the present applications.

BACKGROUND

Technical Field

The present disclosure relates to a flexible display module (unit) and an electronic device comprising the same.

Discussion of the Related Art

Generally, an electronic device such as a television, a monitor, a notebook computer, a smart phone, a tablet computer, an electronic pad, a wearable device, a watch phone, a mobile information device, a navigation, or a vehicle control display device is realized in a multimedia player type having complex function of an image displaying, photo shooting or video recording, audio or video file playing, game, or broadcasting receiving.

The electronic device can include a housing, a flexible display module accommodated in the housing and configured to include a flexible display panel, a flexible circuit board connected with the flexible display panel, and a cover window configured to cover the flexible display module. The flexible display panel has a bending portion which is bent to reduce a bezel width of the electronic device, and the flexible circuit board can be disposed in a rear surface of the flexible display module and can be electrically connected with a pad portion prepared in the bending portion of the flexible display panel.

However, in case of the general electronic device, the flexible display panel and circuits can be damaged by static electricity introduced through a space between the flexible display module and the housing.

SUMMARY OF THE INVENTION

Through various test results for static electricity in an electronic device, the inventors have recognized that a panel bending portion of a flexible display panel and circuit devices disposed in the periphery of the panel bending portion are damaged by static electricity introduced through a speaker hole prepared in a cover window. Accordingly, the inventors have invented a flexible display module having a new structure capable of preventing a panel bending portion of a flexible display panel and circuit devices disposed in the periphery of the panel bending portion from being damaged by static electricity introduced through a speaker hole and an electronic device comprising the same.

The present disclosure has been made in view of the above problems, and it is an object of the present disclosure to provide a flexible display module capable of preventing a flexible display panel from being damaged by static electricity, and an electronic device comprising the same.

According to an embodiment, the present disclosure provides flexible display module comprising a flexible display panel including a display portion, a panel bending portion and a display pad portion, a flexible circuit board connected with the display pad portion and disposed in a rear surface of the flexible display panel, and an electrostatic shielding member configured to cover the panel bending portion of the flexible display panel.

In accordance with an aspect of the present disclosure, the above and other objects can be accomplished by the provision of a flexible display module comprising a flexible display panel including a display portion, a panel bending portion and a display pad portion; a flexible circuit board connected with the display pad portion and disposed in a rear surface of the flexible display panel; and an electrostatic shielding member configured to cover (e.g., covers) the panel bending portion of the flexible display panel.

In accordance with another aspect of the present disclosure, there is provided an electronic device comprising a cover window having an open portion; a flexible display module combined with (e.g., bonded to, attached to, etc.) the cover window; and a housing configured to support (e.g., supports) the cover window and to accommodate the flexible display module, wherein the flexible display module comprises a flexible display panel including a display portion, a panel bending portion and a display pad portion; a flexible circuit board connected with the display pad portion and disposed in a rear surface of the flexible display panel; and an electrostatic shielding member configured to cover (e.g., covers) the panel bending portion of the flexible display panel.

According to one or more embodiments of the present disclosure, it is possible to minimize or prevent the flexible display panel from being damaged by static electricity.

In addition to the objects of the present disclosure as mentioned above, additional objects of the present disclosure will be clearly understood by those skilled in the art from the following description of the present disclosure.

BRIEF DESCRIPTION OF THE DRAWINGS

The accompanying drawings, that can be included to provide a further understanding of the disclosure and are incorporated in and constitute a part of this application, illustrate embodiments of the disclosure and together with the description serve to explain various principles of the disclosure.

DETAILED DESCRIPTION OF THE DISCLOSURE

Figure 1:
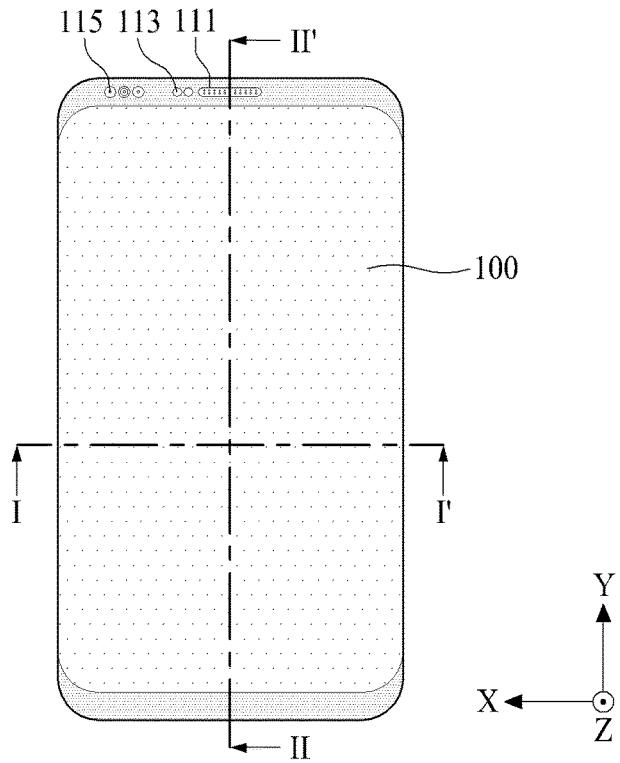
FIG. 1 is a plane view illustrating an electronic device according to one embodiment of the present disclosure.

Advantages and features of the present disclosure, and implementation methods thereof will be clarified through following embodiments described with reference to the accompanying drawings. The present disclosure can, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted.

In a case where 'comprise', 'have', and 'include' described in the present specification are used, another part can be added unless 'only-' is used. The terms of a singular form can include plural forms unless referred to the contrary.

In construing an element, the element is construed as including an error range although there is no explicit description.

In describing a position relationship, for example, when the position relationship is described as 'upon-', 'above-', 'below-', and 'next to-', one or more portions can be arranged between two other portions unless 'just' or 'direct' is used.

In describing a time relationship, for example, when the temporal order is described as 'after-', 'subsequent-', 'next-', and 'before-', a case which is not continuous can be included unless 'just' or 'direct' is used.

It will be understood that, although the terms "first", "second", etc. can be used herein to describe various elements, these elements should not be limited by these terms. These terms are only used to distinguish one element from another. For example, a first element could be termed a second element, and, similarly, a second element could be termed a first element, without departing from the scope of the present disclosure.

It should be understood that the term "at least one" includes all combinations related with any one item. For example, "at least one among a first element, a second element and a third element" can include all combinations of one or more elements selected from the first, second and third elements as well as each element of the first, second and third elements.

Features of various embodiments of the present disclosure can be partially or overall coupled to or combined with (e.g., bonded to, attached to, etc.) each other, and can be variously inter-operated with each other and driven technically as those skilled in the art can sufficiently understand. The embodiments of the present disclosure can be carried out independently from each other, or can be carried out together in co-dependent relationship.

Hereinafter, a flexible display module and an electronic device comprising the same according to the embodiments of the present disclosure will be described in detail with reference to the accompanying drawings. In the specification, in adding reference numerals for elements in each drawing, it should be noted that like reference numerals already used to denote like elements in other drawings are used for elements wherever possible. In the following description, when the detailed description of the relevant known function or configuration is determined to unnecessarily obscure the important point of the present disclosure, the detailed description will be omitted.

Figure 2:
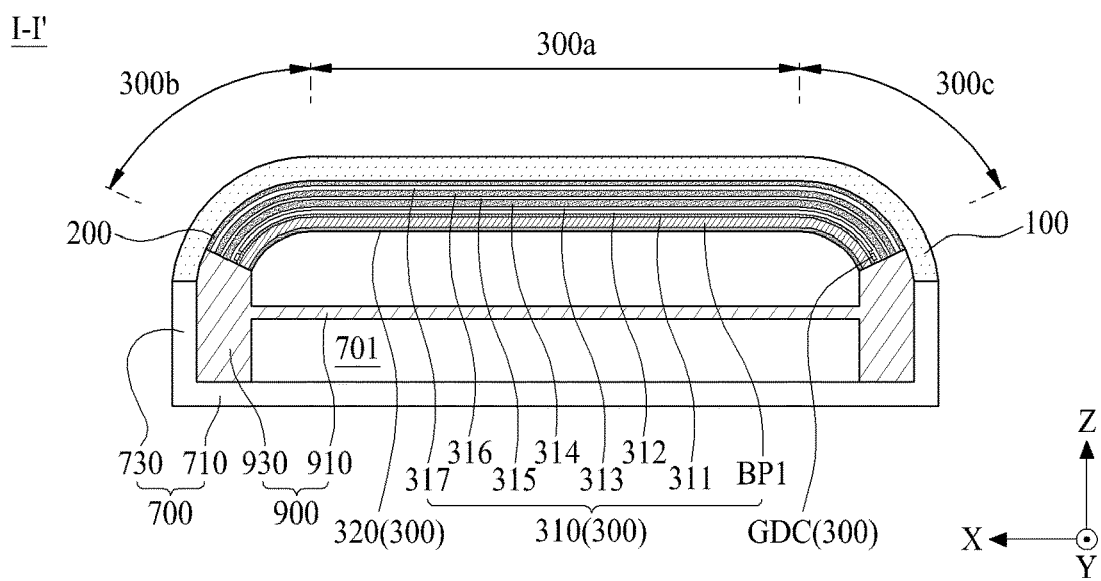
FIG. 2 is a cross-sectional view taken along line I-I' of FIG. 1.
Figure 3:
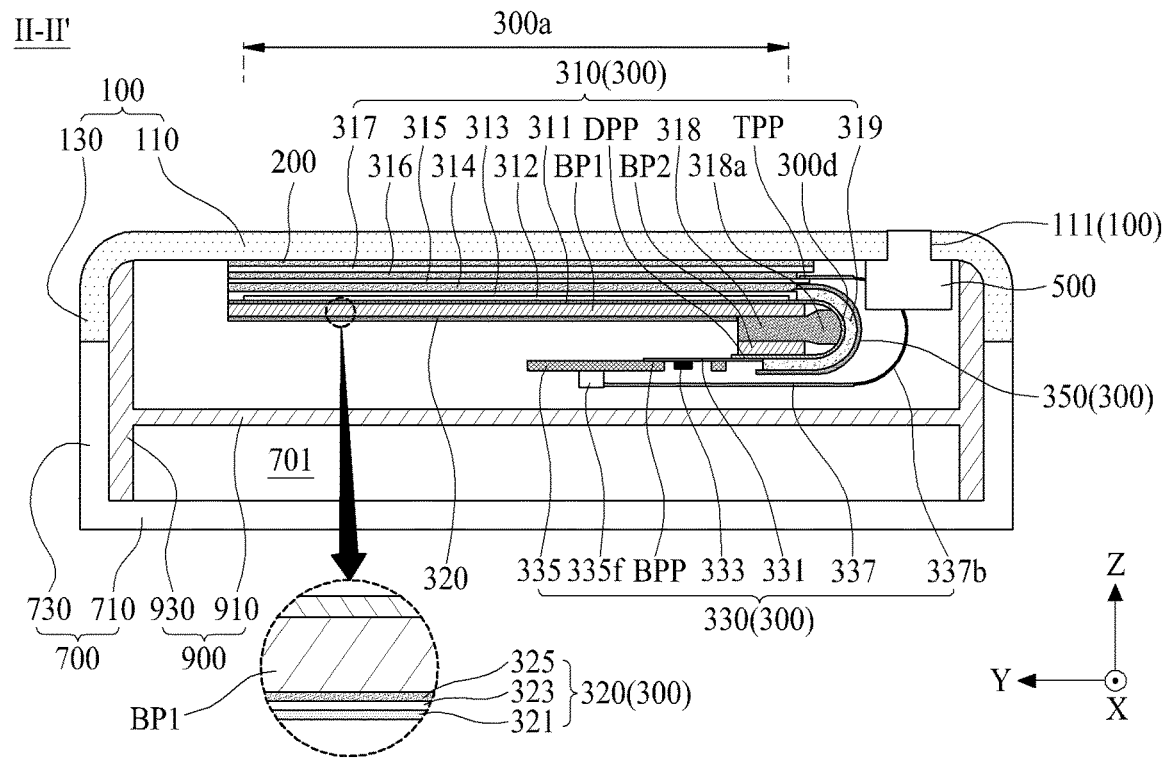
FIG. 3 is a cross-sectional view taken along line II-II' of FIG. 1.
Figure 4:
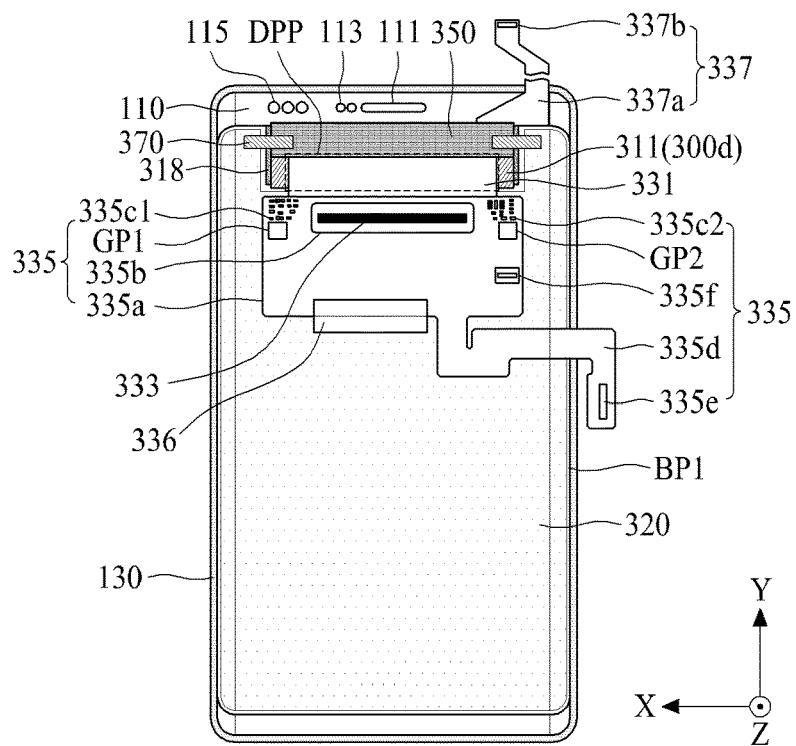
FIG. 4 illustrates a rear surface of a flexible display module shown in FIG. 3.

FIG. 1 is a plane view illustrating an electronic device according to one embodiment of the present disclosure. FIG. 2 is a cross-sectional view taken along line I-I' of FIG. 1. FIG. 3 is a cross-sectional view taken along line II-II' of FIG. 1. FIG. 4 illustrates a rear surface of a flexible display module shown in FIG. 3.

Referring to FIGS. 1 to 4, the electronic device according to one embodiment of the present disclosure can include a cover window 100, a flexible display module (unit) 300, an electronic component module (unit) 500, and a housing 700. Herein, a scale in each of the cover window 100, the flexible display module 300, and the housing 700 shown in FIGS. 1 to 4 can be different from a real scale, for convenience of explanation, whereby it is not limited to the scale shown in the drawings.

The cover window 100 covers front and lateral surfaces of the flexible display module 300, whereby the cover window 100 protects the flexible display module 300 from external shock.

The cover window 100 according to one embodiment of the present disclosure can be formed of any one of a transparent plastic material, a glass material, or a tempered glass material. For example, the cover window 100 can be formed of sapphire glass or gorilla Glass™, or can be formed in a deposition structure of sapphire glass and gorilla glass. According to another example, the cover window 100 can include any one material among PET (polyethylene terephthalate), PC (polycarbonate), PES (polyethersulfone), PEN (polyethylene napthalate), and PNB (polynorbornene). In consideration of scratch and transparency, the cover window 100 can be formed of tempered glass.

The cover window 100 according to one embodiment of the present disclosure can include a front portion 110 and a sidewall portion 130.

The front portion 110 can correspond to a central portion of the cover window 100. Further, the front portion 110 can be a transparent portion through which light passes and can be a central portion of the cover window. The front portion 110 can have a whole flat shape. For example, the front portion 110 can have a planar shape, such that a top surface of the front portion 110 is entirely flat. The front portion 110 according to one embodiment of the present disclosure can include at least one open portion 111 formed in an upper edge portion or lower edge portion, at least one sensor window 113, and at least one camera window 115. Further, each of the at least one open portion 111, the at least one sensor window 113, and the at least one camera window 115 can be formed in the upper edge portion or the lower edge portion of the front portion. Further, the open portion 111, the at least one sensor window 113, and the at least one camera window 115 can be formed adjacent to one another, as illustrated in FIG. 1. The front portion 110 can be expressed as a front window.

The at least one open portion 111 can be a hole (e.g., an aperture) which vertically penetrates through the front portion 110. For example, the at least one open portion 111 can be a hole that penetrates an entire thickness of the front portion 110. Each of the at least one sensor window 113 and the at least one camera window 115 can be a circular transparent area through which ambient light passes. In other words, each of the at least one sensor window 113 and the at least one camera window 115 can be transparent to allow for light to pass there through.

The sidewall portion 130 can be bent in a curved-line shape with a predetermined radius of curvature from the edges of the front portion 110, the edges of the front portion 110 being substantially planar, or being substantially flat. In other words, the sidewall portion 130 is curved from top, bottom and two side edges of the front portion 110, and can have a predetermined radius. For example, the sidewall portion 130 can include a first sidewall which is bent from the first edge (or left edge) of the front portion 110, a second sidewall which is bent from the second edge (or right edge) of the front portion 110, a third sidewall which is bent from the third edge (or upper edge) of the front portion 110, a fourth sidewall which is bent from the fourth edge (or lower edge) of the front portion 110, and a rounding portion connected between each of the first to fourth sidewalls. Accordingly, each edge of the front portion 110 can have a wholly-curved structure by the sidewall portion 130. The sidewall portion 130 can be expressed as a lateral window or lateral curved window.

According as the cover window 100 has a wholly-curved 4-side bending structure, it is possible to realize a good design in the electronic device, and to reduce a bezel width in each of horizontal and vertical directions of the electronic device.

Additionally, the cover window 100 can further include a design layer (or decoration layer) prepared in the edge portion. The design layer is printed at least one time on the edge of a rear surface (or back surface) of the cover window 100 confronting the flexible display module 300 so that it is possible to cover a non-display area on which an image is not displayed in the electronic device. In this case, the design layer can be formed in the edges of the front portion 110 except the open portion 111, the sensor window 113 and the camera window 115. That is, the design layer can be provided any edge of the front portion 110, but can be omitted the at least one open portion 111, the at least one sensor window 113, and the at least one camera window 115.

Selectively, the cover window 100 according to one embodiment of the present disclosure can be formed in a plate shape comprising only the front portion 110. In this case, the aforementioned sidewall portion 130 is omitted. In other words, the entirety of the cover window 100 can have a planar shape, and the cover window 100 can be provided without a curved sidewall portion 130.

The flexible display module 300 can be a flexible display module of a flat display device. For the following description of the present disclosure, it is assumed that the flexible display module 300 is a flexible light emitting display module.

The flexible display module 300 is connected with the rear surface (or back surface) of the cover window 100 so that it is possible to display an image or to sense a user's touch onto the cover window 100. The flexible display module 300 can be bonded to a rear surface of the front portion 110 of the cover window 100. For example, the flexible display module 300 can be bonded to the rear surface of the front portion 110 of the cover window 100 by a direct bonding process using a module bonding member 200, as illustrated in FIGS. 2 and 3. Herein, the module bending member 200 can include pressure sensitive adhesive (PSA), optically clear adhesive (OCA), or optically clear resin (OCR). The module bonding member 200 can be expressed as a transparent adhesive member.

The flexible display module 300 according to one embodiment of the present disclosure can include a display portion 300a, a first bending display portion 300b, and a second bending display portion 300c.

The display portion 300a can be configured to display an image on the front portion 110 of the cover window 100. The first bending display portion 300b, which is bent in shape of curved surface from the first edge of the display portion 300a, enables to display an image on the curved surface of the first sidewall in the sidewall portion 130 of the cover window 100. The second bending display portion 300c, which is bent in shape of curved surface from the second edge of the display portion 300a, enables to display an image on the curved surface of the second sidewall in the sidewall portion 130 of the cover window 100. That is, the flexible display module 300 can be configured to display images on each of the front portion 110 of the cover window and the sidewall portion 130 of the cover window. For example, an image can be display on each of the first, second, third and fourth sidewall portions of the sidewall portion 130 (the left edge, right edge, upper edge, and the lower edge of the sidewall portion 130). Alternatively, an image can be displayed on less than all of the first, second, third and fourth sidewall portions of the sidewall portion 130. Selectively, it is possible to omit the first bending display portion 300b and the second bending display portion 300c. In this case, the display portion 300a of the flexible display module 300 can be overlapped with the front portion 110 of the cover window 100, however, can be not overlapped with the sidewall portion 130.

The flexible display module 300 according to one embodiment of the present disclosure can include a flexible display panel 310 including the display portion 300a, a panel bending portion 300d and a display pad portion DPP, a display driving circuit portion 330 having a flexible circuit board 335 connected with the display pad portion DPP and the display driving circuit portion 330 being disposed in a rear surface of the flexible display panel 310, and an electrostatic shielding member 350 configured to cover the panel bending portion 300d of the flexible display panel 310. That is, the electrostatic shielding member 350 can cover the panel bending portion 300d of the flexible display panel 310.

The flexible display panel 310 can be configured to display an image on each of the display portion 300a, the first bending display portion 300b, and the second bending display portion 300c, or can display an image only on the display portion 300a. Further, the flexible display panel 310 can be configured to display an image on one or more of the display portion 300a, the first bending display portion 300b, and the second bending display portion 300c. The flexible display panel 310 according to one embodiment of the present disclosure can include a flexible substrate 311, a pixel array 312, a gate driving circuit GDC, the display pad portion DPP, an encapsulation portion 313, a touch electrode portion 315, a touch pad portion TPP, a functional film 317, a first back plate BP1, a second back plate BP2, and a bending maintenance member 318.

The flexible substrate 311 can be defined as a base substrate of the flexible display panel 310. That is, the flexible substrate 311 can be abase substrate of the flexible display panel 310. The flexible substrate 311 according to one embodiment of the present disclosure can include a plastic material with flexibility, for example, opaque or colored polyimide (PI). In other words, the flexible substrate 311 can be elastically deformable, and can include an elastically deformable plastic material. The flexible substrate 311 according to another embodiment of the present disclosure can be formed in a thin film of a glass material having flexibility/elasticity.

The pixel array 312 according to one embodiment of the present disclosure is formed on the display portion 300a, the first bending display portion 300b and the second bending display portion 300c defined in the flexible substrate 311, whereby an image can be displayed on each of the display portion 300a, the first bending display portion 300b and the second bending display portion 300c. Alternatively, an image can be displayed on less than each of the display portion 300a, the first bending display portion 300b and the second bending display portion 300c.

The pixel array 312 can include a plurality of pixels which are prepared in a pixel area defined by signal lines on the flexible substrate 311, and the plurality of pixels are configured to display an image in accordance with a signal supplied to the signal lines. The signal lines can include a gate line, a data line and a pixel driving power source line.

Each of the plurality of pixels can include a pixel circuit layer comprising a driving thin film transistor prepared in the pixel area, an anode electrode electrically connected with the driving thin film transistor, an emission device layer formed on the anode electrode, and a cathode electrode electrically connected with the emission device layer.

The driving thin film transistor is prepared in a transistor area of each pixel area defined on the flexible substrate 311, and the driving thin film transistor can include a gate electrode, a gate insulating film, a semiconductor layer, a source electrode and a drain electrode. Herein, the semiconductor layer of the thin film transistor can include silicon of a-Si, poly-Si, or low-temperature poly-si, or can include an oxide such as Indium-Gallium-Zinc-Oxide (IGZO).

The anode electrode is prepared as a pattern shape in an opening area defined in each pixel area, and is electrically connected with the driving thin film transistor.

The emission device layer according to one embodiment of the present disclosure can include an organic light emitting device formed on the anode electrode. The organic light emitting device can be configured to emit the same colored light by each pixel, for example, white colored light by each pixel, or can be configured to emit the different colored light by each pixel, for example, red colored light, green colored light, or blue colored light by each pixel.

The emission device layer according to another embodiment of the present disclosure can include a micro light emitting diode device electrically connected with the anode electrode and the cathode electrode. The micro light emitting diode device can be a light emitting diode realized in an integrated circuit (IC) or chip, wherein the micro light emitting diode device can include a first terminal electrically connected with the anode electrode, and a second terminal electrically connected with the cathode electrode.

The cathode electrode can be connected with an emission device of the emission device layer prepared for each pixel area in common.

The gate driving circuit GDC can be formed in the first edge and/or second edge of the flexible substrate 311 so that the gate driving circuit GDC can be connected with one end and/or the other end in each gate signal line prepared on the flexible substrate 311. The gate driving circuit GDC can generate a gate signal in response to a gate control signal supplied through the display pad portion DPP, and can supply the generated gate signal to each of the plurality of gate lines. The gate driving circuit GDC can be a gate embedded circuit formed for a process of manufacturing the thin film transistor of the pixel, but not limited to this type.

The display pad portion DPP can include a plurality of pad electrodes prepared at one edge (or one-sided non-display area) of the flexible substrate 311 which is apart from one side of the pixel array 312. Each of the plurality of pad electrodes can be electrically connected with the gate driving circuit GDC and the signal line of the pixel array 312 through a link line disposed in a panel bending portion 300d between the display pad portion DPP and one side of the pixel array 312.

The encapsulation portion 313 can be formed on the flexible substrate 311 while being configured to surround the pixel array 312 so that it is possible to prevent oxygen or moisture from being permeated into the emission device layer of the pixel array 312. The encapsulation portion 313 according to one embodiment of the present disclosure can be formed in a multi-layered structure obtained by alternately depositing an organic material layer and an inorganic material layer. Herein, the inorganic material layer prevents oxygen or moisture from being permeated into the emission device layer of the pixel array 312. And, the organic material layer can be formed in a relatively large thickness in comparison to the inorganic material layer so that the organic material layer can cover particles which might be generated during a manufacturing process. For example, the encapsulation portion 313 can include a first inorganic film, an organic film on the first inorganic film, and a second inorganic film on the organic film. In this case, the organic film can be defined as a particle cover layer.

The touch electrode portion 315 is disposed on the encapsulation portion 313, wherein the touch electrode portion 315 serves as a touch sensor capable of sensing a user's touch on the cover window 100.

The touch electrode portion 315 according to one embodiment of the present disclosure can include a touch electrode layer disposed on the encapsulation portion 313 overlapped with the pixel array 312, and a dielectric layer configured to cover the touch electrode layer. Selectively, the touch electrode portion 315 can be provided on a touch buffer layer configured to cover the encapsulation portion 313. For example, the touch electrode layer can include a plurality of touch driving electrodes disposed at fixed intervals on the encapsulation portion 313 overlapped with the pixel array 312, and a plurality of touch sensing electrodes electrically insulated from the touch driving electrodes. The touch sensing electrodes can be disposed in the same layer as the touch driving electrodes, or can be displayed in the different layer from the touch driving electrodes with the dielectric layer interposed in-between.

The touch electrode portion 315 according to another embodiment of the present disclosure can be substituted by a capacitive touch panel generally known to one of ordinary skill in the art. In this case, the touch panel can be attached onto the encapsulation portion 313 by the use of a transparent adhesive member 314. Herein, the transparent adhesive member 314 can include a pressure sensitive adhesive (PSA), an optically clear adhesive (OCA) or an optically clear resin (OCR).

The touch pad portion TPP according to one embodiment of the present disclosure can include a plurality of touch pad electrodes which are disposed in one edge of the touch electrode portion 315 provided in one edge (or upper edge) of the flexible substrate 311 and are electrically connected with the touch electrode portion 315. The plurality of touch pad electrodes can be connected with the touch sensing electrodes and touch driving electrodes through a plurality of touch routing lines in a one-to-one correspondence. The touch pad portion TPP can be overlapped with the link line disposed on the flexible substrate 311.

The touch pad portion TPP according to another embodiment of the present disclosure can be disposed in the other edge of the touch electrode portion 315 provided in the other edge of the flexible substrate 311, and can be connected with the touch sensing electrodes and touch driving electrodes through the plurality of touch routing lines in a one-to-one correspondence.

If the touch electrode portion 315 is substituted by the touch panel, the touch pad portion TPP can be disposed in one edge of the touch panel or the other edge of the touch panel, and can be connected with the touch sensing electrodes and touch driving electrodes through the plurality of touch routing lines in a one-to-one correspondence.

The functional film 317 is attached onto the touch electrode portion 315 by the use of film adhesive member 316, and can be attached to the rear surface (or back surface) of the cover window 100 by the use of a module bonding member 200. Herein, the film adhesive member 316 can include a pressure sensitive adhesive (PSA), an optically clear adhesive (OCA) or an optically clear resin (OCR).

The functional film 317 according to one embodiment of the present disclosure can include a reflection preventing layer (or reflection preventing film) configured to prevent a reflection of ambient light so as to improve contrast ratio and outdoor visibility for an image displayed on the flexible display panel 310. For example, the reflection preventing layer can include a circular polarizing layer (or circular polarizing film) configured to prevent ambient light being incident through the cover window 100 from being reflected on the thin film transistor and/or lines disposed in the pixel array 312 and being advanced toward the cover window 100.

The functional film 317 can further include a barrier layer (or barrier film) configured to firstly prevent a permeation of moisture or oxygen, wherein the barrier layer can be formed of a material with low moisture permeation, for example, polymer.

Also, the functional film 317 can further include a light path control layer (or light path control film) configured to control a path of light emitted from the pixel array 312 to the cover window 100. The light path control layer can have a deposition structure obtained by alternately depositing a high refraction layer and a low refraction layer, whereby a path of light being provided from the pixel array 312 can be changed, to thereby minimize a color shift in accordance with a viewing angle. That is, a high refraction layer can be first deposited, followed by a lower refraction layer, and this pattern of deposition can be repeated to form the light path control layer. Alternatively, the low refraction layer can be first deposited, followed by the high refraction layer, and this alternate pattern of deposition can be repeated.

Selectively, the functional film 317 can be disposed between the touch electrode portion 315 and the encapsulation portion 313. In this case, the touch electrode portion 315 can be attached to the cover window 100 by the use of module bonding member 200.

The first back plate BP1 is attached to the rear surface (or back surface) of the flexible substrate 311 being overlapped with the pixel array 312, whereby the rear surface (or back surface) of the flexible substrate 311 being overlapped with the pixel array 312 is maintained in a plane state.

The second back plate BP2 is attached to one edge of the rear surface (or back surface) of the flexible substrate 311 being overlapped with the display pad portion DPP, whereby the one edge of the rear surface (or back surface) of the flexible substrate 311 is maintained in a plane state.

A link line area of the flexible substrate 311, which is provided with link lines while being overlapped with an open portion between the first back plate BP1 and the second back plate BP2, can be defined as the panel bending portion 300d. Further, the panel bending portion 300 can be bent with a predetermined radius of curvature. That is, the panel bending portion 300d of the flexible substrate 311 is not supported in a plane state by the first back plate BP1 and the second back plate BP2, whereby the panel bending portion 300d of the flexible substrate 311 can be freely bent. Accordingly, the panel bending portion 300d of the flexible substrate 311 is bent to surround one lateral surface of the first back plate BP1 confronting the second back plate BP2, whereby the display pad portion DPP can be overlapped with one rear edge of the first back plate BP1. Thus, the flexible display module 300 is bent to provide a predetermined radius of curvature in the panel bending portion 300d of the flexible substrate 311, to thereby realize a small bezel width.

The bending maintenance member 318 can be disposed between the first back plate BP1 and the second back plate BP2 being overlapped with each other with respect to a thickness direction Z of the flexible display panel 310. The bending maintenance member 318 fixes the second back plate BP2 disposed in the rear surface of the first back plate BP1 to one rear edge of the first back plate BP1 in accordance with the bending of the flexible substrate 311 so that it is possible to maintain the bending state and bending shape of the flexible substrate 311.

One surface (or front surface) of the bending maintenance member 318 can be attached to the first back plate BP1. And, the other surface (or rear surface) of the bending maintenance member 318 can be attached to the second back plate BP2.

The bending maintenance member 318 according to one embodiment of the present disclosure can include a bar-shaped metal material structure, a plastic-material structure, or a double-sided tape. Selectively, the bending maintenance member 318 according to one embodiment of the present disclosure can include a bending guide portion 318a which is protruding toward the panel bending portion 300d of the flexible substrate 311. An outer lateral surface of the bending guide portion 318a can have a curved-line shape which enables bending of the panel bending portion 300d of the flexible substrate 311 in a curved-line shape. For example, the bending guide portion 318a can have a curved shape, thus enabling the panel bending portion 300d to be bent.

The flexible display panel 310 according to one embodiment of the present disclosure can further include a cover layer (or micro cover layer) 319 for covering the panel bending portion 300d of the flexible substrate 311.

The cover layer 319 can cover the panel bending portion 300d of the flexible substrate 311 and be disposed between the encapsulation portion 313 and the display pad portion DPP.

The cover layer 319 can include a polymer material, wherein the cover layer 319 can be coated on to the panel bending portion 300d of the flexible substrate 311 so as to cover the link line between the encapsulation portion 313 and the display pad portion DPP. The cover layer 319 protects the link line from external shock, and also prevents moisture permeation into the link line. Especially, when the panel bending portion 300d of the flexible substrate 311 is bent in a curved-line shape with a predetermined radius of curvature, the cover layer 319 is provided to position the link line on a neutral plane. That is, when the panel bending portion 300d of the flexible substrate 311 is bent with a predetermined radius of curvature, the neutral plane, in which each of a tensile force and a compressive force becomes '0' (zero), exists between the flexible substrate 311 and the cover layer 319. Accordingly, the cover layer 319 can include a material whose elastic coefficient is relatively higher than that of the flexible substrate 311 so that the link lines can be positioned in the neutral plane. Thus, the link lines are positioned in the neutral plane between the cover layer 319 and the flexible substrate 311. That is, when the panel bending portion 300d of the flexible substrate 311 is bent in a curved-line shape, a bending stress of '0' is applied to the link lines positioned in the neutral line between the cover layer 319 and the flexible substrate 311, whereby the link lines can be bent without any damage caused by the bending stress.

The flexible display module 300 according to one embodiment of the present disclosure can further include a conductive heat dissipating portion 320 combined with (e.g., bonded to, attached to, etc.) the rear surface (or back surface) of the flexible display panel 310.

The conductive heat dissipating portion 320 can be attached to the rear surface (or back surface) of the first back plate BP1. The conductive heat dissipating portion 320 protects the flexible display panel 310 from shock, and radiates heat of the flexible display panel 310. That is, the conductive heat dissipating portion 320 can be configured to absorb heat from the flexible display panel 310, to radiate the heat away from the flexible display panel 310, and thus can be construed as a heat sink. The conductive heat dissipating portion 320 can be expressed as a heat dissipating tape, a heat dissipating cushion tape, a conductive heat dissipating tape, a heat dissipating sheet, a heat dissipating ground sheet, or a conductive heat dissipating sheet.

The conductive heat dissipating portion 320 according to one embodiment of the present disclosure can be attached to the entire rear surface of the first back plate BP1. In this case, as one surface (or front surface) of the bending maintenance member 318 is attached to the conductive heat dissipating portion 320, a distance between the first back plate BP1 and the second back plate BP2 is increased so that it is possible to reduce a bending repulsion force by the panel bending portion 300d of the flexible substrate 311 being bent in a curved-line shape. Alternatively, the conductive heat dissipating portion 320 according to another embodiment of the present disclosure can be attached to less than the entire rear surface of the first back plate BP1.

The conductive heat dissipating portion 320 according to one embodiment of the present disclosure can be attached to the remaining portions of the rear surface of the first back plate BP1 except for an arrangement area for the bending maintenance member 318. In this case, one surface (or front surface) of the bending maintenance member 318 is directly attached to the first back plate BP1 from which some portions of the conductive heat dissipating portion 320 are removed, whereby a thickness of the flexible display panel 310 can be reduced.

The conductive heat dissipating portion 320 according to one embodiment of the present disclosure can include a heat dissipating member 321, a cushion member 323 and an adhesive member 325, or any combination thereof.

The heat dissipating member 321 can include a heat dissipating layer having a metal material with a relatively high thermal conductivity. The heat dissipating layer of the heat dissipating member 321 according to one embodiment of the present disclosure can include a metal layer comprising copper (Cu). The heat dissipating member 321 according to another embodiment of the present disclosure can include a metal layer comprising copper (Cu), and a graphite layer coated onto the metal layer. The heat dissipating member 321 can provide a heat dissipating function, a ground function, and a protection function for protecting the rear surface of the flexible display panel 310.

The cushion member 323 can include a foam tape or foam pad connected with a front surface of the heat dissipating member 321. The cushion member 323 can absorb a shock, including vibrational shock and other mechanical shock.

The adhesive member 325 can be connected with a front surface of the cushion member 323. The adhesive member 325 can include an uneven surface structure (or embossing structure) formed in its surface. The uneven surface structure of the adhesive member 325 prevents bubbles from being generated between the first back plate BP1 and the conductive heat dissipating member 320 for an attachment process between the first back plate BP1 and the conductive heat dissipating portion 320, so that it is possible to omit a deformation process for removing bubbles generated between the first back plate BP1 and the conductive heat dissipating portion 320.

The display driving circuit portion 330 can be connected with the display pad portion DPP of the flexible display panel 310, whereby the display driving circuit portion 330 can be disposed in the rear surface of the flexible display panel 310. The display driving circuit portion 330 can display an image on the pixel array 312 of the flexible display panel 310, and can sense a user's touch through the touch electrode portion 315 of the flexible display panel 310.

The display driving circuit portion 330 according to one embodiment of the present disclosure can include a panel flexible circuit film 331, a driving integrated circuit 333, a flexible circuit board 335, and a touch flexible circuit film 337.

The panel flexible circuit film 331 can be electrically connected with the display pad portion DPP prepared in the flexible substrate 311, while being disposed in the rear surface of the flexible display panel 310. The panel flexible circuit film 331 can be attached to the display pad portion DPP prepared in the flexible substrate 311 through the use of film attachment process using an anisotropic conductive film. For example, the panel flexible circuit film 331 can be a chip on film.

The driving integrated circuit 333 can be mounted on the panel flexible circuit film 331 disposed in the rear surface of the flexible display panel 310. The driving integrated circuit 333 according to one embodiment of the present disclosure can be mounted on the panel flexible circuit film 331 by a chip bonding process or surface mounting process. The driving integrated circuit 333 can generate a data signal and a gate control signal on the basis of timing synchronized signal and video data supplied from an external host driving system (or host driving circuit), can supply the data signal to the data line of each pixel through the display pad portion DPP, and can supply the gate control signal to the gate driving circuit GDC. The driving integrated circuit 333 can be disposed in the rear surface of the flexible display panel 310.

Alternatively, the driving integrated circuit 333 is not mounted on the panel flexible circuit film 331, and is mounted (or bounded onto) on a chip mounting area defined in the flexible substrate 311, whereby the driving integrated circuit 333 can be electrically connected with the display pad portion DPP, and can be connected with the signal line in each of the pixel array 312 and the gate driving circuit GDC disposed on the flexible substrate 311. In this case, the panel flexible circuit film 331 can relay a signal transport between the display pad portion DPP and the host driving system, or can be omitted.

The flexible circuit board 335 can be electrically connected with the panel flexible circuit film 331 in the rear surface of the flexible display panel 310. The flexible circuit board 335 according to one embodiment of the present disclosure can be electrically connected with a pad electrode portion prepared in the panel flexible circuit film 331 by a film attachment process using an anisotropic conductive film, and can be overlapped with the first back plate BP1 of the flexible display panel 310. The flexible circuit board 335 can provide the timing synchronized signal and video data, supplied from the host driving system, to the driving integrated circuit 333 through the display pad portion DPP, and can provide voltages which are needed for driving the pixel array 312, the gate driving circuit, and the driving integrated circuit 333. The flexible circuit board 335 can be expressed as a main flexible printed circuit board or a display driving circuit board.

The flexible circuit board 335 according to one embodiment of the present disclosure can include a circuit body portion 335a, a board opening portion 335b, first circuit components 335c1, second circuit components 335c2, an extension line portion 335d, and a board connector 335e, as illustrated in FIG. 4.

The circuit body portion 335a can be electrically connected with the pad electrode portion prepared in the panel flexible circuit film 331. The circuit body portion 335a can include a board pad portion BPP disposed in one surface confronting the conductive heat dissipating portion 320. The board pad portion BPP can be electrically connected with the pad electrode portion prepared in the panel flexible circuit film 331 by a film attachment process using an anisotropic conductive film. For example, the circuit body portion 335a can have a rectangular shape.

Another edge, of the circuit body portion 335a can be fixed to the conductive heat dissipating portion 320 by the use of adhesive tape 336. In this case, one side of the adhesive tape 336 can be adhered to the another edge of the circuit body portion 335a, and the other side of the adhesive tape 336 can be adhered to the conductive heat dissipating portion 320. Selectively, the adhesive tape 336 can electrically connect a ground terminal prepared in the circuit body portion 335a with the conductive heat dissipating portion 320. In this case, the adhesive tape 336 can be a conductive tape comprising a conductive layer being in electrical contact with each of the conductive heat dissipating portion 320 and the ground terminal prepared in the circuit body portion 335a.

The board opening portion 335b can be provided in the circuit body portion 335a, while being adjacent to the board pad portion BPP. For example, the board opening portion 335b can penetrate through the circuit body portion 335a and can have a size enabling an insertion of the driving integrated circuit 333 mounted on the panel flexible circuit film 331. The board opening portion 335b can be expressed as an integrated circuit insertion hole. Thus, in an embodiment of the present disclosure, the driving integrated circuit 333 is inserted into the board opening portion 335b, whereby the flexible circuit board 335 and the driving integrated circuit 333 are disposed while being overlapped with each other, to thereby reduce an occupying area of the display driving circuit portion 330 in the flexible display module 300, and furthermore, to reduce a thickness of the flexible display module 300.

Alternatively, it is possible to omit the board opening portion 335b from the electronic device in accordance with a circuit arrangement space prepared in the rear surface of the flexible display module 300. Also, the board pad portion BPP can be disposed in one edge of the circuit body portion 335a being adjacent to the panel flexible circuit film 331. In this case, the driving integrated circuit 333 can be mounted on the panel flexible circuit film 331, which is not overlapped with the flexible circuit board 335. For example, the driving integrated circuit 333 can be mounted on the panel flexible circuit film 331, where the flexible circuit film 331 is disposed between the end of the flexible substrate 311 and the flexible circuit board 335.

The first circuit components 335c1 can be mounted on the first edge area (or left edge area) of the circuit body portion 335a with respect to a first direction X. For example, the first circuit components 335c1 can be mounted on the first edge area of the circuit body portion 335a being adjacent to one side of the board opening portion 335b. The first circuit components 335c1 according to one embodiment of the present disclosure can include at least one among a resistor, a capacitor, an inductor, and an integrated circuit.

The second circuit components 335c2 can be mounted on the second edge area (or right edge area) of the circuit body portion 335a with respect to the first direction X. For example, the second circuit components 335c2 can be mounted on the second edge area of the circuit body portion 335a being adjacent to the other side of the board opening portion 335b. The second circuit components 335c2 according to one embodiment of the present disclosure can include at least one among a resistor, a capacitor, an inductor, and an integrated circuit.

The extension line portion 335d can extend by a predetermined length from the other edge of the circuit body portion 335a. For example, the extension line portion 335d can have a linear shape or non-linear shape. The length and shape of the extension line portion 335d can be set in accordance with a position of the host driving system (or host driving board) disposed in the rear surface of the flexible display module 300. In other words, the extension line portion 335d can sized and shaped to allow for connection to the host driving system through the board connector 335e.

The board connector 335e can be provided in the end of the extension line portion 335d and can be electrically connected with the host driving system.

The flexible circuit board 335 according to one embodiment of the present disclosure can further include at least one first ground pad GP1 disposed in the circuit body portion 335a, and at least one second ground pad GP2 disposed in the circuit body portion 335a. The at least one first ground pad GP1 can be spaced from the at least one second ground pad GP2.

The at least one first ground pad GP1 can be prepared in the first edge area of the circuit body portion 335a, while being adjacent to the first circuit components 335c1. The at least one first ground pad GP1 can be electrically connected with the conductive heat dissipating portion 320.

The at least one second ground pad GP2 can be prepared in the second edge area of the circuit body portion 335a, while being adjacent to the second circuit components 335c2. The at least one second ground pad GP2 can be electrically connected with the conductive heat dissipating portion 320.

The flexible circuit board 335 according to one embodiment of the present disclosure can further include a touch connector 335f. The touch connector 335f can be mounted on the circuit body portion 335a, and can be electrically connected with the touch flexible circuit film 337.

The touch flexible circuit film 337 can be electrically connected with the touch pad portion TPP prepared in the flexible display panel 310 by a film attachment process using an anisotropic conductive film, and can be electrically connected with the touch connector 335f mounted on the flexible circuit board 335. The touch flexible circuit film 337 can supply a touch driving signal, which is provided from the flexible circuit board 335, to the touch electrodes through the touch pad portion TPP. Further, the touch flexible circuit film 337 can supply a signal corresponding to a capacitance change in the touch electrodes to the flexible circuit board 335 through the touch pad portion TPP.

The touch flexible circuit film 337 according to one embodiment of the present disclosure can include a touch bonding portion attached to the touch pad portion TPP, a touch connector terminal 337b connected with the touch connector 335f of the flexible circuit board 335, a film bending portion 337a between the touch bonding portion and the touch connector terminal 337b, and a circuit portion between the film bending portion 337a and the touch connector terminal 337b. The film bending portion 337a can be bent in a curved-line shape to surround the panel bending portion 300d of the flexible substrate 311. In this case, the touch flexible circuit film 337 can have uneven surface portions caused by a bending repulsive force of the film bending portion 337a. In order to prevent the uneven surface portions of the touch flexible circuit film 337, at least some portions of the film bending portion 337a can have a relatively smaller thickness in comparison to that of the circuit portion.

Alternatively, the touch flexible circuit film 337 can be connected with the host driving system instead of the touch connector 335f of the flexible circuit board 335. In this case, it is possible to omit the touch connector 335f mounted on the flexible circuit board 335.

The electrostatic shielding member 350 can be disposed adjacent to the open portion 111 prepared in the cover window 100, so that it is possible to minimize or prevent the panel bending portion 300d of the flexible display panel 310 and the circuit components disposed adjacent to the panel bending portion 300d from being damaged by static electricity introduced through the open portion 111.

The electrostatic shielding member 350 can cover the panel bending portion 300d of the flexible display panel 310. The electrostatic shielding member 350 can be disposed to cover the panel bending portion 300d of the flexible display panel 310, which is bent in a curved-line shape (e.g., has a curved shape). For example, the electrostatic shielding member 350 can be attached to the cover layer 319 configured to cover the panel bending portion 300d of the flexible substrate 311.

The electrostatic shielding member 350 according to one embodiment of the present disclosure can include a metal layer configured to cover the panel bending portion 300d of the flexible display panel 310, and a conductive adhesion layer combined with (e.g., bonded to, attached to, etc.) the metal layer and adhered to the panel bending portion 300d of the flexible display panel 310. In this case, the metal layer can include copper or aluminum, and the conductive adhesion layer can include a conductive acryl adhesive.

In one example, the electrostatic shielding member 350 can be electrically connected with the conductive heat dissipating portion 320 in the rear surface of the flexible display panel 310. In this case, the electrostatic shielding member 350 can be electrically connected with the heat dissipating member 321 of the conductive heat dissipating member 320 through a conductive strap member 370. However, multiple conductive strap members can be used, as illustrated in FIG. 4. The conductive strap member 370 according to one embodiment of the present disclosure can electrically connect at least one of one edge portion and another edge portion of the electrostatic shielding member 350 with the conductive heat dissipating portion 320. For example, the conductive strap member 370 can include a conductive single-sided tape. As the conductive heat dissipating portion 320 is electrically connected with the electrostatic shielding member 350 through the conductive strap member 370, it is possible to remove static electricity introduced to the electrostatic shielding member 350.

In another example, the electrostatic shielding member 350 can be electrically connected with the ground pad of the flexible circuit board 335 in the rear surface of the flexible display panel 310. In this case, the electrostatic shielding member 350 can be electrically connected with the ground pad of the flexible circuit board 335 through a conductive connection member. The conductive connection member according to embodiment of the present disclosure can electrically connect at least one of one edge portion and another edge portion of the electrostatic shielding member 350 with the ground pad of the flexible circuit board 335. For example, the conductive connection member can include a conductive single-sided tape. According as the ground pad of the flexible circuit board 335 is electrically connected with the electrostatic shielding member 350 through the conductive strap member 370, it is possible to remove static electricity introduced to the electrostatic shielding member 350.

The electrostatic shielding member 350 can be attached to the panel bending portion 300d of the flexible display panel 310 adjacent to the open portion 111 which is prepared in the cover window 100, so that it is possible to minimize or prevent the panel bending portion of the flexible display panel 310 and the circuit components disposed adjacent to the bending portion from being damaged by static electricity introduced through the open portion 111 of the cover window 100.

The electronic component module 500 can be provided in the open portion 111 prepared in the cover window 100. For example, the electronic component module 500 (unit) can be accommodated in the housing 700 overlapped with the open portion 111 prepared in the cover window 100, and can be inserted into the open portion 111. Accordingly, the electronic component module 500 vertically penetrates through the cover window 100 through the open portion 111, whereby the electronic component module 500 can be exposed to the front portion 110 of the cover window 100.

The electronic component module 500 according to one embodiment of the present disclosure can include a speaker module configured to output a sound. The speaker can be configured to output any type of sound. For example, if the electronic device is a smart phone, a mobile terminal, or the like, the speaker module can be a receiver configured to output a telephone sound, or any other sound.

The electronic component module 500 according to another embodiment of the present disclosure can include a peripheral circuit module (or auxiliary unit) of the electronic device exposed to the external through the cover window 100. For example, if the electronic device is a smart phone, the peripheral circuit module can include a fingerprint sensor, a touch pressure sensor or a home button.

The electronic device according to one embodiment of the present disclosure can further include at least one sensor module (unit) which is accommodated in the housing 700 while being overlapped with at least one sensor window 113 prepared in the cover window 100, and a camera module (unit) having at least one camera unit which is accommodated in the housing 700, while being overlapped with at least one camera window 115. In other words, the electronic device according to one embodiment of the present disclosure can further include at least one sensor module which is accommodated in the housing 700, each sensor module being overlapped with a corresponding sensor window 113 prepared in the cover window 100. Further, the electronic device module can further comprise a camera module having at least one camera unit which is accommodated in the housing 700, each camera unit being overlapped with a corresponding camera window 115. Herein, the sensor module can include an illumination sensor, a proximity sensor, a motion sensor or an RGB sensor.

The housing 700 can accommodate the flexible display module 300, and can support the cover window 100. For example, the housing 700 is combined with (e.g., bonded to, attached to, etc.) the sidewall portion 130 of the cover window 100, to thereby support the cover window 100.

The housing 700 according to one embodiment of the present disclosure can further include a rear housing 710 configured to cover the rear surface of the flexible display module 300 under the condition that a circuit receiving space 701 is interposed in-between, and a lateral housing 730 configured to support the cover window 100.

The rear housing 710 is disposed in the outermost rear surface of the electronic device, wherein the rear housing 710 can include a plastic material, a metal material, or a glass material. For example, the rear housing 710 can include a glass material with a color coating layer. Alternatively, the rear housing 710 can include a transparent glass material without a color coating layer.

The lateral housing 730 according to one embodiment of the present disclosure is disposed in the outermost lateral surface of the electronic device, wherein the lateral housing 730 can be bent from the edge of the rear housing 710 and be connected with the sidewall portion 130 of the cover window 100. In other words, the lateral housing 730 can have a curved shape from the edge of the rear housing 710 and be connected with the sidewall portion 130 of the cover window 100.

The lateral housing 730 according to another embodiment of the present disclosure can be formed of a plastic material, a metal material, or a glass material, and can be disposed in the edge of the sidewall portion 130 of the cover window 100.

The circuit receiving space 701 is prepared between the rear surface of the flexible display module 300 and the rear housing 710, wherein the host driving system, memory and battery can be accommodated in the circuit receiving space 701.

The electronic device according to one embodiment of the present disclosure can further include a middle frame 900.

The middle frame 900 is disposed in the circuit receiving space 701 of the housing 700, and the middle frame 900 can support circuit components disposed in the circuit receiving space 701. The middle frame 900 can support the cover window 100. The middle frame 900 according to one embodiment of the present disclosure can include a middle plate 910 and a middle sidewall 930.

The middle plate 910, which is disposed between the rear surface of the flexible display module 300 and the rear housing 710, can support the circuit components disposed in the circuit receiving space 701.

The middle sidewall 930, which is vertically connected with a lateral surface of the middle plate 910, can support the sidewall portion 130 of the cover window 100.

Selectively, the lateral housing 730 of the housing 700 can be substituted by the middle sidewall 930 of the middle frame 900. In this case, the middle sidewall 930 of the middle frame 900 can be disposed between the sidewall portion 130 of the cover window 100 and the edge of the rear housing 710, whereby it is possible to omit the lateral housing 730 of the housing 700.

The flexible display module 300 according to one embodiment of the present disclosure and the electronic device comprising the same include the electrostatic shielding member 350 which is disposed adjacent to the open portion 111 prepared in the cover window 100 so that it is possible to prevent the panel bending portion 300d of the flexible display panel 310 and the circuit components disposed adjacent to the panel bending portion 300d from being damaged by static electricity introduced through the open portion 111, to thereby improve reliability in the static electricity.

Figure 5A:
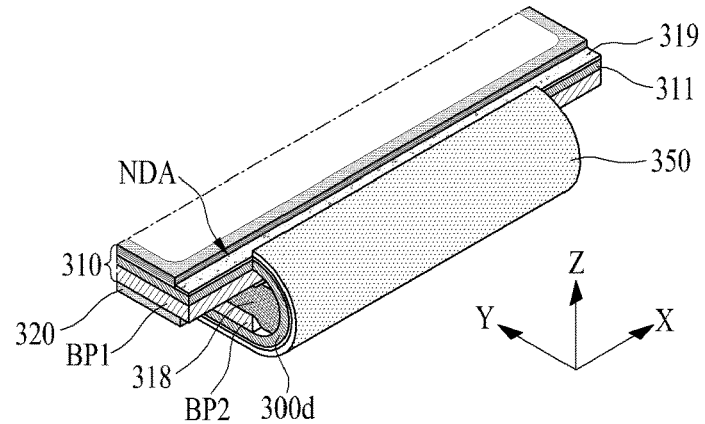
FIGS. 5A to 5C illustrate embodiments of an electrostatic shielding member according to the present disclosure.
Figure 5B:
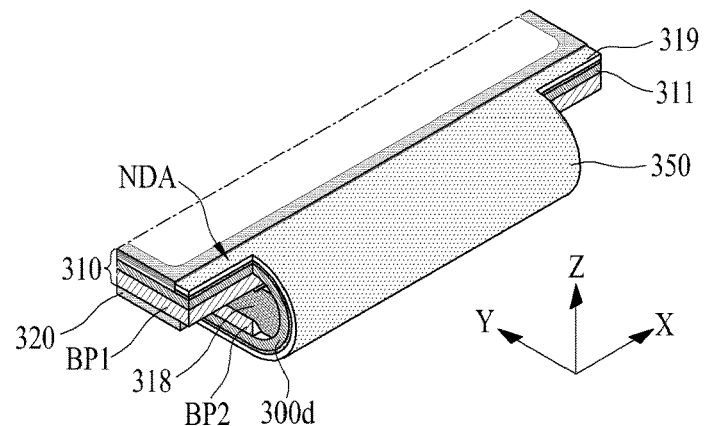
Figure 5C:
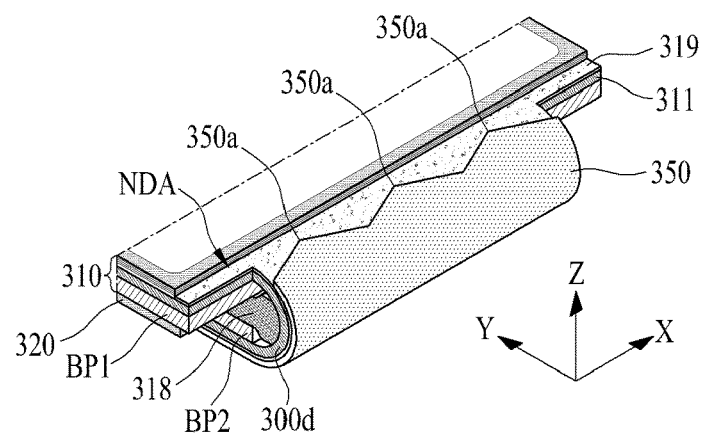

FIGS. 5A to 5C illustrate embodiments of the electrostatic shielding member according to the present disclosure.

Referring to FIG. 5A in connection with FIG. 3, the electrostatic shielding member 350 according to one embodiment of the present disclosure can cover all the panel bending portion 300d of the flexible display panel 310, which is bent in the curved-line shape while being adjacent to the open portion 111 prepared in the cover window 100. For example, the electrostatic shielding member 350 can be formed in a rectangular shape, and can be attached to the cover layer 319 disposed on the panel bending portion 300d of the flexible display panel 310. The electrostatic shielding member 350 according to one embodiment of the present disclosure prevents the static electricity being introduced toward the panel bending portion 300d of the flexible display panel 310 through the open portion 111 of the cover window 100, to thereby protect the link lines disposed on the panel bending portion 300d of the flexible display panel 310 from the static electricity.

Referring to FIG. 5B in connection with FIG. 3, the electrostatic shielding member 350 according to another embodiment of the present disclosure can cover the non-display area NDA of a plane shape disposed between the display portion 300a and the panel bending portion 300d, and the panel bending portion 300d of the flexible display panel 310 which is bent in the curved-line shape. For example, the electrostatic shielding member 350 is formed in shape of "T", and can be attached to the cover layer 319 disposed on the panel bending portion 300d of the flexible display panel 310 and the non-display area NDA of the plane shape being adjacent to the panel bending portion 300d. The electrostatic shielding member 350 according to another embodiment of the present disclosure prevents the static electricity from being introduced toward the panel bending portion 300d of the flexible display panel 310 through the open portion 111 of the cover window 100, to thereby protect the link lines disposed on the panel bending portion 300d of the flexible display panel 310 and the non-display area NDA having a plane shape being adjacent to the panel bending portion 300d of the flexible display panel 310 from the static electricity. In other words, the electrostatic shielding member 350 protects the link lines disposed on the panel bending portion 300d of the flexible display panel 310 and the non-display area NDA from static electricity. The non-display area NDA can be substantially planar, however, the non-display area NDA is not limited to a planar shape. Further, the non-display area NDA can be located directly adjacent to the panel bending portion 300d of the flexible display panel 310, and can be located above the panel bending portion 300d of the flexible display panel 310.

Referring to FIG. 5C in connection with FIG. 3, the electrostatic shielding member 350 according to another embodiment of the present disclosure can be formed in a lightning rod structure (e.g., can be formed to at least one triangular shaped edge portion at one edge thereof), and can be configured to cover the panel bending portion 300d of the flexible display panel 310 which is bent in the curved-line shape. For example, the electrostatic shielding member 350 according to another embodiment of the present disclosure can be formed in a line shape having one edge with at least one apex portion/triangular shaped edge portion 350a, and can be attached to the cover layer 319 disposed on the panel bending portion 300d of the flexible display panel 310. One edge portion of the electrostatic shielding member 350 can be disposed adjacent to the non-display area NDA of the plane shape and disposed between the display portion 300a and the panel bending portion 300d. The electrostatic shielding member 350 according to another embodiment of the present disclosure prevents the static electricity introduced to the panel bending portion 300d of the flexible display panel 310 through the open portion 111 of the cover window 100, so that it is possible to protect the link lines and the circuit disposed on the panel bending portion 300d of the flexible display panel 310 from static electricity. Especially, in case of the electrostatic shielding member 350 according to another embodiment of the present disclosure, one edge of the electrostatic shielding member 350 is adjacent to the open portion 111 of the cover window 100 and has the lightning rod structure with at least one apex portion 350a to facilitate easier collection of the static electricity introduced through the open portion 111 of the cover window 100.

Additionally, one edge portion of the electrostatic shielding member 350 can be peeled off from the panel bending portion 300d due to the lowering of adhesion strength in accordance with a temperature and a curved-line shape of the panel bending portion 300d. In this case, at least one apex portion 350a, which is peeled off from the panel bending portion 300d, is positioned more adjacent (e.g., closer) to the open portion 111 of the cover window 100 so that it enables the improved collection efficiency of the static electricity introduced through the open portion 111 of the cover window 100. Accordingly, the remaining portions of the electrostatic shielding member 350 except its one edge can be attached to the panel bending portion 300d.

Figure 6:
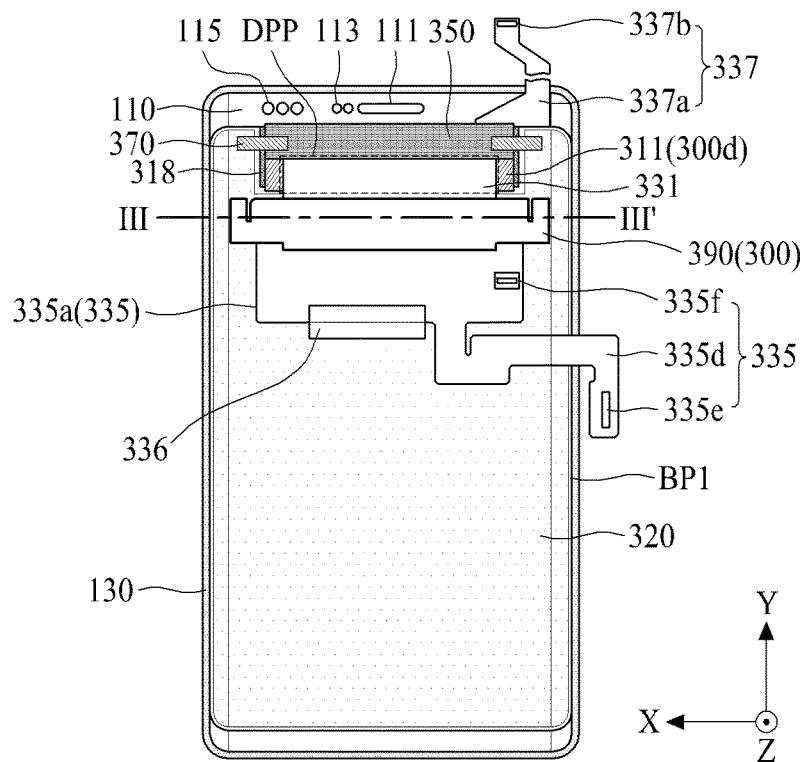
FIG. 6 illustrates a rear surface of a flexible display module shown in FIG. 3.
Figure 7:
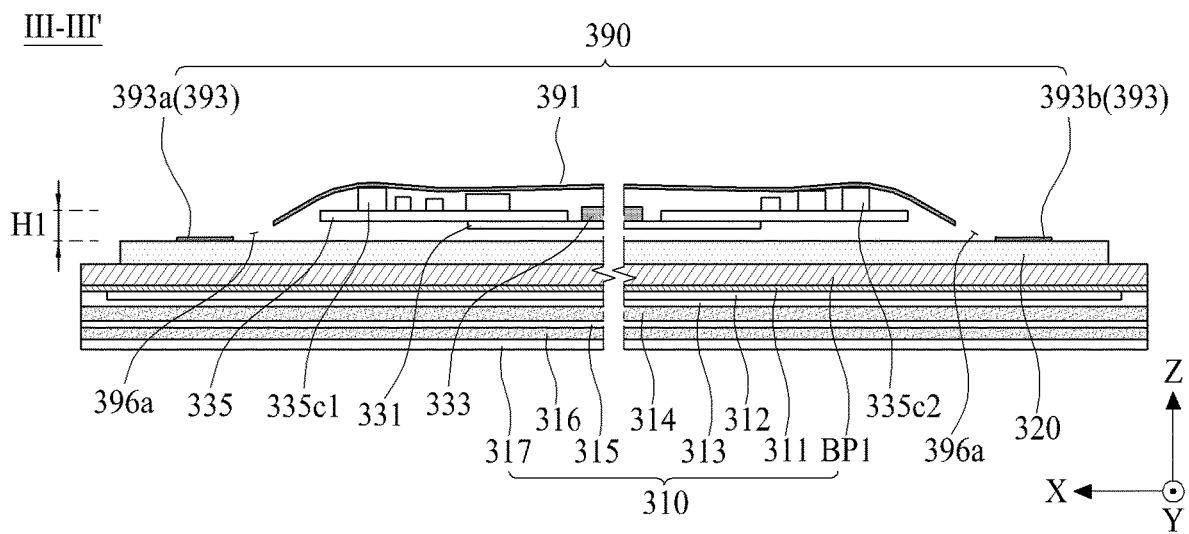
FIG. 7 is a cross-sectional view taken along line III-III' of FIG. 6.

FIG. 6 illustrates the rear surface of the flexible display module shown in FIG. 3. FIG. 7 is a cross-sectional view taken along line III-III' of FIG. 6, which is obtained by additionally providing a cover member 390 to the flexible display module 300.

Referring to FIGS. 3, 4, 6 and 7, the flexible display module 300 according to one embodiment of the present disclosure can further include a cover member 390 which is attached to the rear surface of the flexible display panel 310 and is configured to restrict lifting of the flexible circuit board 335. In other words, the cover member 390 secures the flexible circuit board 335 via its connection with the flexible display panel.

The cover member 390 can be attached to the rear surface of the flexible display panel 310 while being overlapped with the flexible circuit board 335.

The cover member 390 according to one embodiment of the present disclosure can be disposed in one edge portion of the flexible circuit board 335, and is attached to the conductive heat dissipating portion 320 of the flexible display panel 310, whereby the cover member 390 can cover each of the board opening portion 335b, the first circuit components 335c1, the second circuit components 335c2, the first ground pad GP1, and the second ground pad GP2 of the flexible circuit board 335, and also can cover the driving integrated circuit 333 inserted into the board opening portion 335b of the flexible circuit board 335.

As the cover member 390 is attached to the conductive heat dissipating portion 320 while being configured to cover one edge portion of the flexible circuit board 335, it is possible to prevent or restrict the lifting of the flexible circuit board 335. Further, the cover member prevents or restricts thermal deformation of the flexible circuit board 335. Also, the cover member 390 can cover the driving integrated circuit 333 mounted on the panel flexible circuit film 331 or the flexible substrate 311 so that it is possible to protect the driving integrated circuit 333 from shock, and/or to prevent direct contact between the driving integrated circuit 333 and other structures. And, the cover member 390 can electrically connect each of the first and second ground pads GP1 and GP2 prepared in the flexible circuit board 333 to the conductive heat dissipating portion 320.

Figure 8:
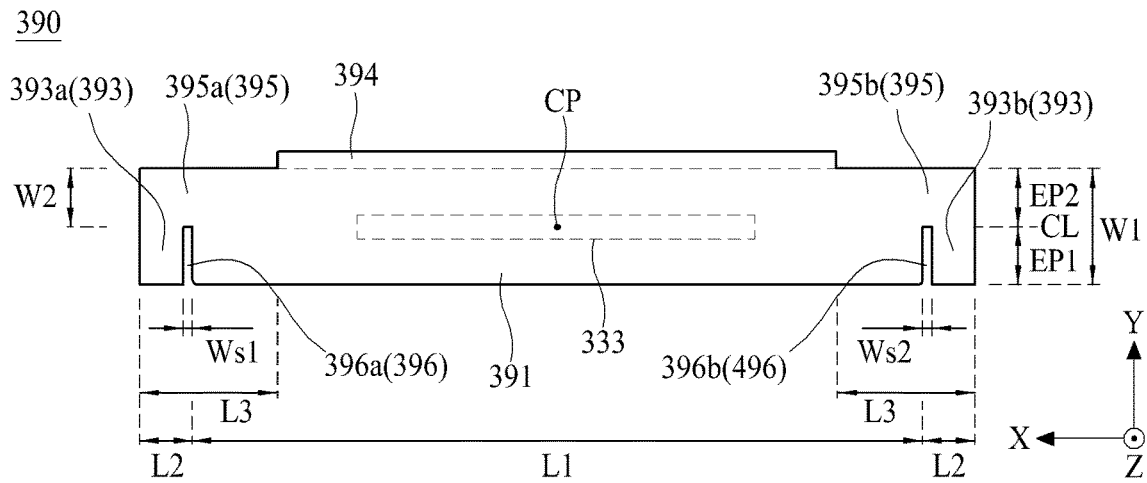
FIG. 8 is a plane view illustrating the cover member shown in FIG. 6.
Figure 9:
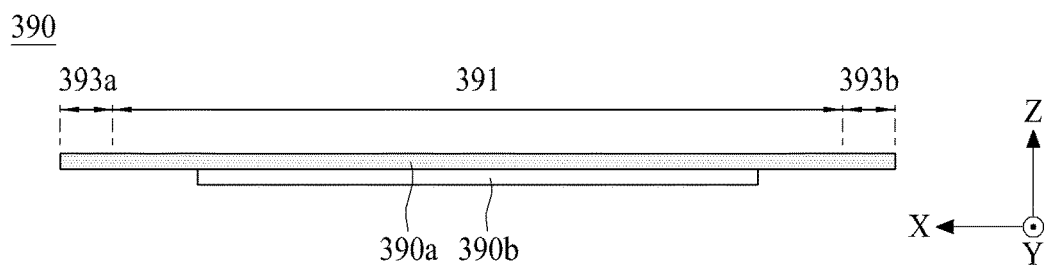
FIG. 9 is a cross sectional view illustrating the cover member shown in FIG. 8.

FIG. 8 is a plane view illustrating the cover member shown in FIG. 6, and FIG. 9 is a cross sectional view illustrating the cover member shown in FIG. 8.

Referring to FIGS. 6 to 9, the cover member 390 according to one embodiment of the present disclosure can include a cover body portion 391, a cover adhesion portion 393, and a bridge 395.

The cover body portion 391 can be overlapped with the flexible circuit board 335. The cover body portion 391 according to one embodiment of the present disclosure can be overlapped with one edge of the flexible circuit board 335 being adjacent to the display pad portion DPP of the flexible display panel 310. Accordingly, the cover body portion 391 can cover the board opening portion 335b of the flexible circuit board 335, the first and second circuit components 335c1 and 335c2, the first and second ground pads GP1 and GP2, and the driving integrated circuit 333 which is inserted into the board opening portion 335b of the flexible circuit board 335. The cover body portion 391 can cover any one edge of the flexible circuit board 335, whereby the cover body portion 391 can be expressed as a cover area.

A central portion CP of the cover body portion 391 can be overlapped with a central portion of the driving integrated circuit 333, but the central portion CP is not limited to this structure. Within an allowance in the consideration of a manufacturing process of the cover member 390 and an attachment process of the cover member 390, the central portion CP of the cover body portion 391 can be overlapped with the central portion of the driving integrated circuit 333. For example, the central portion CP of the cover body portion 391 and the central portion of the driving integrated circuit 333 can be overlapped with each other within a range of 0.4 mm. In other words, the central portion CP of the cover body portion 391 can be is spaced from the central portion of the driving integrated circuit 333 up to 0.4 mm. Further, the central portion CP of the cover body portion 391 can be vertically aligned with the central portion of the driving integrated circuit 333.

The cover body portion 391 according to one embodiment of the present disclosure can have a first length L1 which is parallel to a first direction X (or length direction), and a first width W1 which is parallel to a second direction Y (or width direction) being perpendicular to the first direction X. The first length L1 of the cover body portion 391 can be relatively longer than a length of the flexible circuit board 335 being parallel to the first direction X.

With respect to the first direction X, the cover body portion 391 can include a middle portion disposed on the flexible circuit board 335, and an edge portion which is inclined between the middle portion and the cover adhesion portion 393. The middle portion of the cover body portion 391 can be configured to cover any one edge of the flexible circuit board 335, and also can be supported by the first and second circuit components 335c1 and 335c2 disposed in one edge of the flexible circuit board 335. The edge portion of the cover body portion 391 can be inclined or bent in a curved-line shape to surround one edge or both edges of the flexible circuit board 335. In other words, the edge portion of the cover body portion 391 can have a curved shape surrounding one or a plurality of edges of the flexible circuit board 335.

With respect to the second direction Y (or width direction), the cover body portion 391 can include a first edge portion EP1 disposed in a lower side of a central line CL, and a second edge portion EP2 disposed in an upper side of the central line CL. In this case, in comparison to the second edge portion EP2, first edge portion EP1 of the cover body portion 391 can be relatively close to the display pad portion DPP of the flexible display panel 310.

The cover adhesion portion 393 can be provided in plurality, connected with both sides of the cover body portion 391, and attached to the rear surface of the flexible display panel 310. In other words, the cover adhesion portion 393 can be separately provided on different portions of the cover body portion 391 for attaching the cover body portion 391 to the rear surface of the flexible display panel 310. The cover adhesion portion 393 with a predetermined length and width can protrude (or extend) from both sides of the cover body portion 391, and the cover adhesion portion 393 can be attached to the conductive heat dissipating portion 320 of the flexible display panel 310. The cover adhesion portion 393 is attached to the conductive heat dissipating portion 320, whereby the cover adhesion portion 393 can be expressed as an attachment area or fixing area.

The cover adhesion portion 393 according to one embodiment of the present disclosure can include a first adhesion portion 393a and a second adhesion portion 393b.

The first adhesion portion 393a is connected with one side (or left side) of the cover body portion 391, and can be attached to the conductive heat dissipating portion 320 of the flexible display panel 310. The second adhesion portion 393b is connected with the other side (or right side) of the cover body portion 391, and can be attached to the conductive heat dissipating portion 320 of the flexible display panel 310.

Each of the first adhesion portion 393a and the second adhesion portion 393b according to one embodiment of the present disclosure can include a second length L2 which is parallel to the first direction X, and a first width W1 which is the same as the first width W1 of the cover body portion 391. For example, the second length L2 in each of the first adhesion portion 393a and the second adhesion portion 393b can be set to be 1.5 mm or more than 1.5 mm in consideration of a stable adhesion between the cover member 390 and the conductive heat dissipating portion 320. In order words, the second length L2 in each of the first adhesion portion 393a and the second adhesion portion 393b can be altered to allow for strong and reliable adhesion between the cover member 390 and the conductive heat dissipating portion 320.

The bridge 395 is disposed between the cover body portion 391 and the cover adhesion portion 393, whereby the cover body portion 391 and the cover adhesion portion 393 can be connected with each other through the use of bridge 395. With respect to a second direction Y (or width direction), the bridge 395 can connect both ends of the other edge portion EP2 of the cover body portion 391 with the cover adhesion portion 393. The bridge 395 distributes a deforming force or a force causing uneven surface portions in the flexible circuit board 335, to thereby prevent a separation of the cover adhesion portion 393.

For example, with respect to the second direction Y, the first edge portion EP1 of the cover body portion 391 is separated from the cover adhesion portion 393, and the second edge portion EP2 of the cover body portion 391 is connected with the cover adhesion portion 393, whereby some of the deforming force (or force causing uneven surface portions) of the flexible circuit board 335 can be transmitted to the second edge portion EP2 of the cover body portion 391, and the remaining of the deforming force (or force causing uneven surface portions) of the flexible circuit board 335 can be transmitted to the first edge portion EP1 of the cover body portion 391. Accordingly, some of the deforming force (or force causing uneven surface portions) of the flexible circuit board 335 can be transmitted to the cover adhesion portion 393 through the bridge 395 so that it is possible to prevent the separation of the cover adhesion portion 393 by the distribution of the deforming force of the flexible circuit board 335. And, the bridge 395 partially separates the cover body portion 391 and the cover adhesion portion 393 from each other so that it is possible to independently maintain an adhesion between the cover body portion 391 and ground pads GP1 and GP2 prepared in the flexible circuit board 335 and an adhesion between the conductive heat dissipating portion 320 and the cover adhesion portion 393.

The bridge 395 according to one embodiment of the present disclosure can have a second width W2, which is smaller than the first W1 of the cover body portion 391, with respect to a width direction being parallel to the second direction Y. For example, the second width W2 of the bridge 395 can be more than the half of the first width W1 of the cover body portion 391, and can be less than the first width W1 of the cover body portion 391. Herein, if the second width W2 of the bridge 395 is less than the half of the first width W1 of the cover body portion 391, the bridge 395 can be cut by the uneven surface portions (or deformation) of the flexible circuit board 335. The bridge 395 can be formed by a cutting process for forming vertical slits 396a and 396b along a direction being parallel to the second direction Y in the cover member 390 between the cover body portion 391 and the cover adhesion portion 393.

The bridge 395 according to one embodiment of the present disclosure can include a first bridge 395a configured to connect the cover body portion 391 and the first adhesion portion 393a with each other, and a second bridge 395b configured to connect the cover body portion 391 and the second adhesion portion 393b with each other.

The first bridge 395a can be connected between the first adhesion portion 393a and one side (or left side) of the other edge portion EP2 of the cover body portion 391. For example, a connection structure between the first adhesion portion 393a and the first bridge 395a can have a two-dimensional structure of "⌐" shape.

The second bridge 395b can be connected with the second adhesion portion 393b and the other side (or right side) of the other edge portion EP2 of the cover body portion 391. For example, a connection structure between the second adhesion portion 393b and the second bridge 395b can have a two-dimensional structure of "¬" shape.

With respect to the first direction X, each a width Ws1 of the first bridge 395a (or vertical slit) and a width Ws2 of the second bridge 395b can be set to be more than a height H1 between an upper surface of the flexible circuit board 335 and the conductive heat dissipating portion 320. In other words, the height H1 is a height between an upper surface of the flexible circuit board 335 and an upper surface of the conductive heat dissipating portion 320. Herein, if each in the width Ws1 of the first bridge 395a and the width Ws2 of the second bridge 395b is set to be less than the height H1 between the upper surface of the flexible circuit board 335 and the conductive heat dissipating portion 320, each of the first adhesion portion 393a and the second adhesion portion 393b can be separated from the conductive heat dissipating portion 320 by the uneven surface portions (or deformation) of the flexible circuit board 335.

The cover member 390 according to one embodiment of the present disclosure can further include a cover protruding portion 394.

The cover protruding portion 394 can protrude from another side of the cover body portion 391 and can be overlapped with the upper periphery of the board opening portion 335b of the flexible circuit board 335 so that it is possible to prevent the board opening portion 335b of the flexible circuit board 335 from being exposed by an attachment process error of the cover member 390.

The cover member 390 according to one embodiment of the present disclosure can include a conductive tape 390a and an insulating tape 390b.

The conductive tape 390a can include the cover body portion 391 and the cover adhesion portion 393. For example, the conductive tape 390a can include a base film, a metal layer attached to a rear surface of the base film by the use of adhesion layer, and a conductive adhesion layer formed on a rear surface of the metal layer.

The insulating tape 390b can be configured to include the cover body portion 391 and can be attached to a rear surface of the conductive tape 390a. For example, the insulating tape 390b can be attached to the remaining portions except the portions, which are overlapped with the first and second ground pads GP1 and GP2 prepared in the flexible circuit board 335, in the cover body portion 391 of the conductive tape 390a. The insulating tape 390b is disposed in the cover body portion 391 of the conductive tape 390a, whereby the metal layer disposed in the cover body portion 391 of the conductive tape 390a is electrically insulated from the circuit components 335c1 and 335c2 mounted on the flexible circuit board 335.

As the insulating tape 390b is not attached to the metal layer disposed in the cover adhesion portion 393 of the conductive tape 350a, the metal layer disposed in the cover adhesion portion 393 of the conductive tape 390a can be electrically connected with the conductive heat dissipating portion 320 by the use of a conductive adhesion layer. As the insulating tape 390b is not attached to some of the metal layer disposed in the first and second edges of the cover body portion 391 of the conductive tape 390a, some of the metal layer disposed in the first and second edges of the cover body portion 391 of the conductive tape 390a can be electrically connected with each of the first and second ground pads GP1 and GP2 prepared in the flexible circuit board 335 through the use of a conductive adhesion layer. Further, each of the first and second ground pads GP1 and GP2 of the flexible circuit board 335 can be electrically connected with the conductive heat dissipating portion 320 through the conductive tape 390a disposed in each of the cover adhesion portion 393 and the cover body portion 391 of the cover member 390.

The cover member 390 according to one embodiment of the present disclosure includes the cover body portion 391 configured to cover the flexible circuit board 335, and the cover adhesion portion 393 attached to the conductive heat dissipating portion 320, so that it is possible to prevent or restrict the lifting of the flexible circuit board 335, and also to prevent or minimize the separation of the cover adhesion portion 393 by a deforming force (or force causing the uneven surface portions) of the cover body portion 391 in accordance with the uneven surface portions of the flexible circuit board 335. Also, in case of the cover member 390 according to one embodiment of the present disclosure, the force (or deforming force) causing the uneven surface portions in the flexible circuit board 335 is distributed by the use of bridge 395 (or slit 396) disposed between the cover body portion 391 and the cover adhesion portion 393 so that it is possible to prevent the separation of the cover adhesion portion 393 from the conductive heat dissipating portion 320. Also, it is possible to independently maintain the adhesion between the cover body portion 391 and the ground pads GP1 and GP2 prepared in the flexible circuit board 335 and the adhesion between the conductive heat dissipating portion 320 and the cover adhesion portion 393. Thus, according to the present disclosure, the lifting (or floating) of the flexible circuit board 335 can be prevented or restricted through the use of cover member 390, the circuit components 335c1 and 335c2 mounted on the flexible circuit board 335 can be protected, and the ground pads GP1 and GP2 prepared in the flexible circuit board 335 can be grounded to the conductive heat dissipating portion 320 disposed in the rear surface of the flexible display panel 310.

Figure 10:
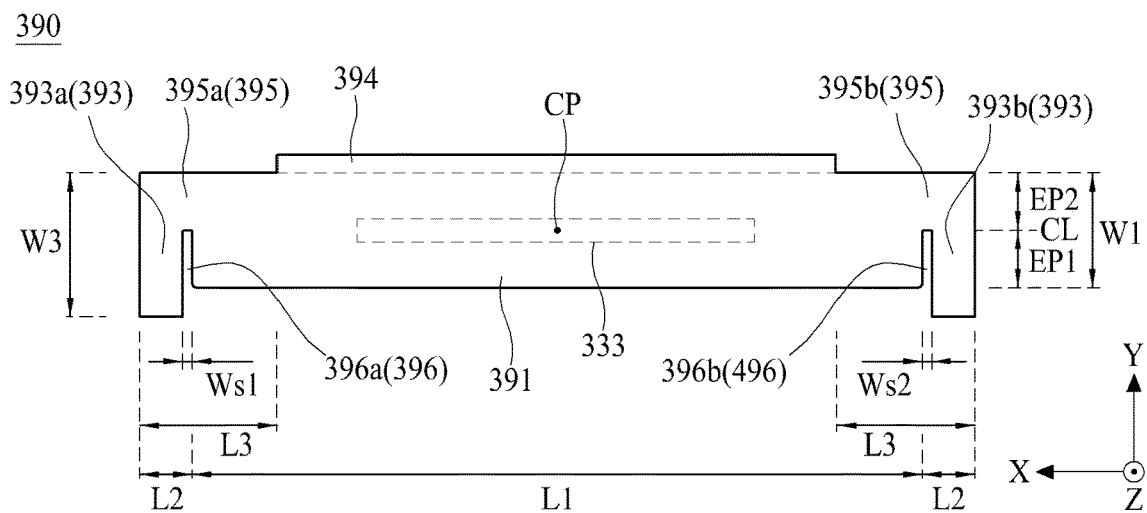
FIG. 10 is a plane view illustrating a modified embodiment of the cover member shown in FIGS. 8 and 9.

Additionally, in case of the cover member 390 according to one embodiment of the present disclosure, the first and second adhesion portions 393a and 393b of the cover adhesion portion 393 can have a third width W4, which is larger than the first width W1 of the cover body portion 391, with respect to a width direction being parallel to the second direction Y, as shown in FIG. 10. That is, the first and second adhesion portions 393a and 393b can have the third width W4, which is more than the first width W1 of the cover body portion 391, with respect to the width direction being parallel to the second direction Y. In this case, an adhesion area between the conductive heat dissipating portion 320 and each of the first and second adhesion portions 393a and 393b is increased so that it is possible to minimize the separation of each of the first and second adhesion portions 393a and 393b by the uneven surface portions (or deformation) of the flexible circuit board 335.

Figure 11:
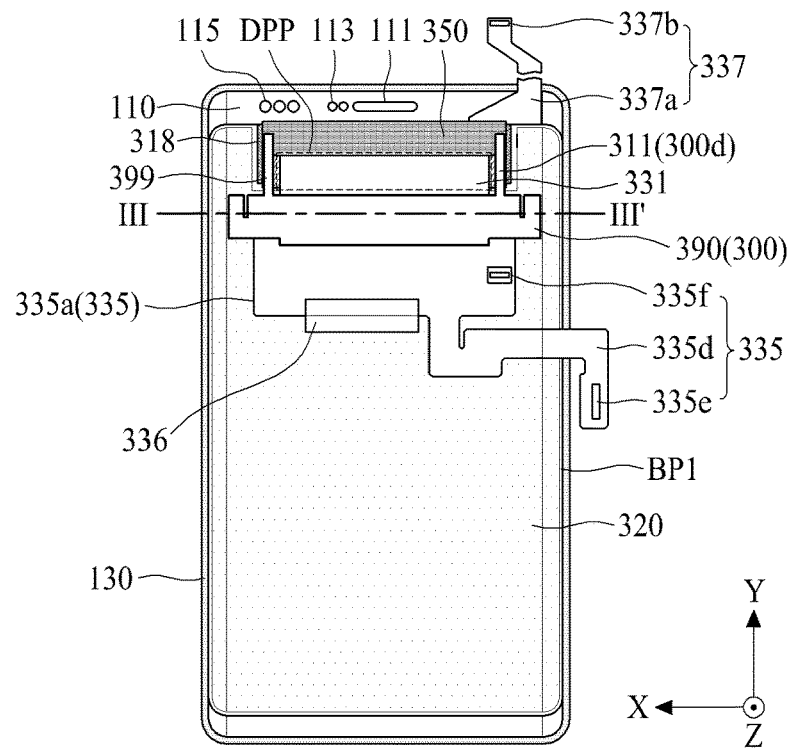
FIG. 11 is a rear view illustrating a flexible display module so as to explain another embodiment of the cover member shown in FIG. 6.
Figure 12:
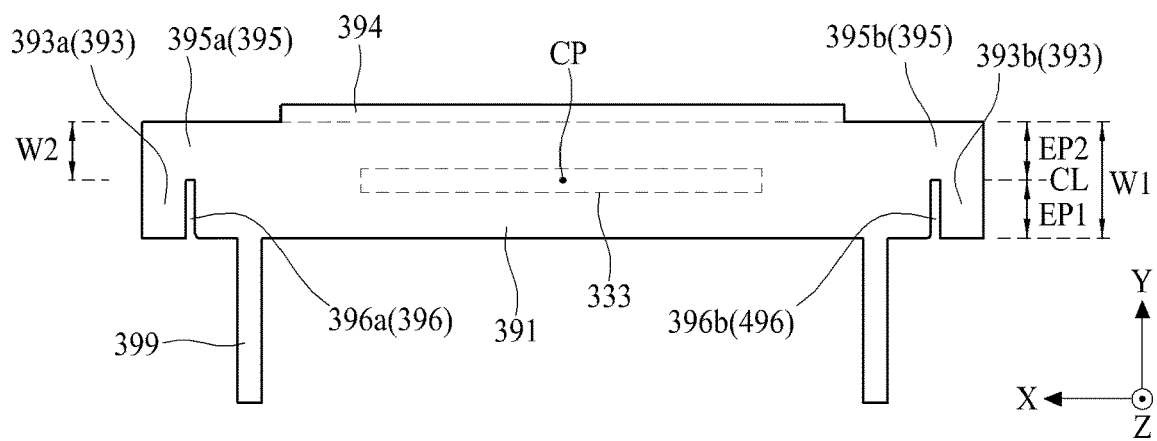
FIG. 12 illustrates the cover member shown in FIG. 11.

FIG. 11 is a rear view illustrating the flexible display module so as to explain another embodiment of the cover member shown in FIG. 6, and FIG. 12 illustrates the cover member shown in FIG. 11, in which the cover member and the conductive strap member shown in FIG. 6 are formed as one body.

Referring to FIGS. 11 and 12 in connection with FIG. 7, the cover member 390 according to another embodiment of the present disclosure can further include an electrostatic path member 399. The electrostatic path member 399 can be provided in plurality and can extend from one side of the cover member 390.

The electrostatic path member 399 protrudes (or extends) from at least one of one side and the other side of one edge portion EP1 of the cover body portion 391, and can be electrically connected with the electrostatic shielding member 350. For example, the electrostatic path member 399 extends from each of one side of the other side of one edge portion EP1 of the cover body portion 391 in the second direction Y or toward the electrostatic shielding member 350, and can be electrically connected with each of one side of the other side of the electrostatic shielding member 350. The electrostatic path member 399 electrically connects the electrostatic shielding member 350 with the conductive heat dissipating portion 320, whereby it is possible to form an electrostatic path for transmitting the static electricity, which is induced in the electrostatic shielding member 350, to the conductive heat dissipating portion 320. Thus, the static electricity introduced through the open portion of the cover window can flow in the conductive heat dissipating portion 320 via the electrostatic shielding member 350 disposed on the panel bending portion 300d of the flexible display panel 310, and the electrostatic path member 339, the cover body portion 391 and the cover adhesion portion 393 included in the cover member 390.

The cover member 390 according to another embodiment of the present disclosure can prevent or restrict the lifting of the flexible circuit board 335, and also can transmit the static electricity, which is introduced to the electrostatic shielding member 350 through the open portion of the cover window, to the conductive heat dissipating portion 320. Accordingly, the electronic device including the cover member 390 according to another embodiment of the present disclosure can electrically connect the electrostatic shielding member 350 with the conductive heat dissipating portion 320 through the cover member 390 without the conductive strap member shown in FIG. 6.

Meanwhile, if the cover member 390 includes the electrostatic path member 399, one edge portion EP1 of the cover member 390 is fixed to the electrostatic shielding member 350 through the electrostatic path member 399 so that it is possible to prevent or minimize the uneven surface portions of the cover body portion 391 in accordance with the uneven surface portions of the flexible circuit board 335. Also, it can be unnecessary to provide the bridge 395 and the slit 396 disposed between the cover body portion 391 and the cover adhesion portion 393 and configured to prevent the separation of the cover adhesion portion 393 in accordance with the uneven surface portions of the cover body portion 391, whereby the cover adhesion portion 393 of the cover member 390 can be directly connected with both lateral surfaces of the cover body portion 391, to thereby omit the bridge 395 and the slit 396 disposed between the cover body portion 391 and the cover adhesion portion 393.

The flexible display module according to the embodiment of the present disclosure and the electronic device comprising the same can be described as follows.

According to an embodiment of the present disclosure, a flexible display module comprises a flexible display panel including a display portion, a panel bending portion and a display pad portion; a flexible circuit board connected with the display pad portion and disposed in a rear surface of the flexible display panel; and an electrostatic shielding member configured to cover the panel bending portion of the flexible display panel.

According to one or more embodiments of the present disclosure, the flexible display module can further include a conductive heat dissipating portion combined with (e.g., bonded to, attached to, etc.) the rear surface of the flexible display panel, wherein the electrostatic shielding member can be electrically connected with the conductive heat dissipating portion in the rear surface of the flexible display panel.

According to one or more embodiments of the present disclosure, the flexible display module can further include a conductive strap member configured to electrically connect the electrostatic shielding member and the conductive heat dissipating portion with each other.

According to one or more embodiments of the present disclosure, the panel bending portion of the flexible display panel can be bent in a curved-line shape, and the electrostatic shielding member can cover the panel bending portion of the flexible display panel which is bent in the curved-line shape.

According to one or more embodiments of the present disclosure, the flexible display panel can include a non-display area of a plane shape between the display portion and the panel bending portion, the panel bending portion of the flexible display panel can be bent in the curved-line shape, and the electrostatic shielding member can be formed in shape of a "T", and can be configured to cover the non-display area of the plane shape and the panel bending portion of the flexible display panel bent in the curved-line shape.

According to one or more embodiments of the present disclosure, the electrostatic shielding member can include at least one apex portion.

According to one or more embodiments of the present disclosure, the flexible display panel can include a non-display area of a plane shape disposed between the display portion and the panel bending portion, the panel bending portion of the flexible display panel can be bent in a curved-line shape from the non-display area of the plane shape, the electrostatic shielding member can cover the panel bending portion of the flexible display panel which is bent in the curved-line shape, and at least one apex portion of the electrostatic shielding member can be disposed on the panel bending portion of the flexible display panel being adjacent to the non-display area of the plane shape.

According to one or more embodiments of the present disclosure, the flexible display panel can include a flexible substrate having the display portion, the panel bending portion and the display pad portion; a first back plate combined with (e.g., bonded to, attached to, etc.) a rear surface of the flexible substrate which is overlapped with the display portion; a second back plate combined with (e.g., bonded to, attached to, etc.) the rear surface of the flexible substrate which is overlapped with the display pad portion; and a bending maintenance member disposed between the first back plate and the second back plate, wherein the conductive heat dissipating portion is combined with (e.g., bonded to, attached to, etc.) a rear surface of the first back plate.

According to one or more embodiments of the present disclosure, the flexible display panel can further include a cover layer configured to cover the panel bending portion of the flexible substrate, and the electrostatic shielding member can be attached to the cover layer.

According to one or more embodiments of the present disclosure, the conductive heat dissipating portion can include a heat dissipating member; a cushion member combined with (e.g., bonded to, attached to, etc.) the heat dissipating member; and an adhesion member combined with (e.g., bonded to, attached to, etc.) the cushion member and combined with (e.g., bonded to, attached to, etc.) the rear surface of the first back plate, and the heat dissipating member can be electrically connected with the electrostatic shielding member.

According to one or more embodiments of the present disclosure, the flexible display module can further include a cover member attached to the rear surface of the flexible display panel and configured to restrict lifting of the flexible circuit board, wherein the cover member can include a cover body portion overlapped with the flexible circuit board; and a cover adhesion portion connected with both sides of the cover body portion and attached to the conductive heat dissipating portion.

According to one or more embodiments of the present disclosure, the cover member can further include a slit provided between the cover adhesion portion and the cover body portion.

According to one or more embodiments of the present disclosure, the cover adhesion portion can have a width which is identical to or larger than a width of the cover body portion with respect to a width direction of the cover member.

According to one or more embodiments of the present disclosure, the flexible circuit board can include at least one ground pad, the cover body portion can be attached to the at least one ground pad, and the cover adhesion portion can be attached to the conductive heat dissipating portion.

According to one or more embodiments of the present disclosure, the cover member can include a conductive tape having the cover body portion and the cover adhesion portion; and an insulating tape attached to a rear surface of the conductive tape disposed on the flexible circuit board and configured to have the cover body portion.

According to one or more embodiments of the present disclosure, the cover member can further include an electrostatic path member extending from the cover body portion and electrically connected with the electrostatic shielding member.

According to one or more embodiments of the present disclosure, the electrostatic shielding member can include a metal layer; and a conductive adhesion layer combined with (e.g., bonded to, attached to, etc.) the metal layer and attached to the panel bending portion of the flexible display panel.

According to the embodiment of the present disclosure, an electronic device comprises a cover window having an open portion; a flexible display module combined with (e.g., bonded to, attached to, etc.) the cover window; and a housing configured to support the cover window and to accommodate the flexible display module, wherein the flexible display module comprises a flexible display panel including a display portion, a panel bending portion and a display pad portion; a flexible circuit board connected with the display pad portion and disposed in a rear surface of the flexible display panel; and an electrostatic shielding member configured to cover the panel bending portion of the flexible display panel.

According to one or more embodiments of the present disclosure, the electronic device can further include an electronic component module disposed in the open portion of the cover window, wherein the cover window can include a front portion configured to include the open portion adjacent to a panel bending portion of a flexible display panel, and configured to cover the flexible display module; and a sidewall portion bent from an edge of the front portion.

According to one or more embodiments of the present disclosure, the electronic component module can include a speaker module (unit).

In addition to the effects of the present disclosure as mentioned above, additional advantages and features of the present disclosure will be clearly understood by those skilled in the art from the above description of the present disclosure.

It will be apparent to those skilled in the art that the present disclosure described above is not limited by the above-described embodiments and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if needed to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A flexible display apparatus comprising:
   a flexible substrate including a display portion, a bending portion and a pad portion;
   a first back plate configured to support the display portion of the flexible substrate;
   a second back plate configured to support the pad portion of the flexible substrate;
   a bending maintenance member disposed between the first back plate and the second back plate and configured to support the bending portion of the flexible substrate; and
   a conductive heat dissipating portion disposed to a rear surface of the first back plate,
   wherein the conductive heat dissipating portion includes:
   a heat dissipating member:
   a cushion member attached to the heat dissipating member; and
   an adhesion member attached to the cushion member and attached to the rear surface of the first back plate.

2. The flexible display apparatus of claim 1, wherein a size of the bending maintenance member is smaller than the first back plate.

3. The flexible display apparatus of claim 1, wherein the bending maintenance member non-overlaps with the conductive heat dissipating portion.

4. The flexible display apparatus of claim 1,
wherein the bending maintenance member is attached to the rear surface of the first back plate, or
wherein the bending maintenance member and the conductive heat dissipating portion are attached to the rear surface of the first back plate.

5. The flexible display apparatus of claim 1, further comprising an electrostatic shielding member at the bending portion.

6. The flexible display apparatus of claim 5, wherein the electrostatic shielding member is electrically connected to the conductive heat dissipating portion.

7. The flexible display apparatus of claim 5, further comprising a conductive strap member electrically connected to the electrostatic shielding member and the conductive heat dissipating portion.

8. The flexible display apparatus of claim 5, wherein the bending portion has a curved-line shape.

9. The flexible display apparatus of claim 5,
wherein the electrostatic shielding member includes at least one apex portion, or
wherein the electrostatic shielding member includes at least one apex portion adjacent to the display portion.

10. The flexible display apparatus of claim 5,
wherein the flexible substrate includes a non-display area between the display portion and the bending portion, and
wherein the electrostatic shielding member is disposed on the non-display area and the bending portion.

11. The flexible display apparatus of claim 5, further comprising a cover layer covers the bending portion,
wherein the electrostatic shielding member is disposed on the cover layer.

12. The flexible display apparatus of claim 5,
wherein the heat dissipating member is electrically connected with the electrostatic shielding member.

13. The flexible display apparatus of claim 5, further comprising a flexible circuit board connected with the pad portion and disposed at a rear surface of the flexible substrate.

14. The flexible display apparatus of claim 13, further comprising a cover member attached to the rear surface of the flexible substrate and configured to restrict lifting of the flexible circuit board,
wherein the cover member includes:
a cover body portion overlapping the flexible circuit board; and
a cover adhesion portion connected with two sides of the cover body portion and attached to the conductive heat dissipating portion.

15. The flexible display apparatus of claim 14, wherein the cover member further includes a slit provided between the cover adhesion portion and the cover body portion.

16. The flexible display apparatus of claim 14,
wherein the flexible circuit board includes at least one ground pad,
the cover body portion is attached to the at least one ground pad, and
the cover adhesion portion is attached to the conductive heat dissipating portion.

17. The flexible display apparatus of claim 16, wherein the cover member further includes an electrostatic path member extending from the cover body portion, the electrostatic path member being electrically connected with the electrostatic shielding member.

18. An electronic device comprising:
the flexible display apparatus according to claim 1, wherein the flexible display apparatus includes:
a cover window having an open portion,
a flexible display panel being attached to the cover window and including the flexible substrate, the first back plate, the second back plate, the bending maintenance member, and the conductive heat dissipating portion, and
a housing configured to support the cover window and to accommodate the flexible display panel.

19. The electronic device of claim 18, further comprising an electronic component module disposed in the open portion of the cover window.

20. The electronic device of claim 19, wherein the electronic component module includes a speaker module or a camera module.

21. A flexible display apparatus comprising:
a flexible substrate including a display portion, a bending portion and a pad portion;
a first back plate configured to support the display portion of the flexible substrate;
a second back plate configured to support the pad portion of the flexible substrate;
a bending maintenance member disposed between the first back plate and the second back plate and configured to support the bending portion of the flexible substrate;
a conductive heat dissipating portion disposed to a rear surface of the first back plate; and
an electrostatic shielding member at the bending portion.

* * * * *